United States Patent [19]

Kataoka et al.

[11] Patent Number: 5,530,264
[45] Date of Patent: Jun. 25, 1996

[54] PHOTOELECTRIC CONVERSION DEVICE AND PHOTOELECTRIC CONVERSION MODULE EACH HAVING A PROTECTIVE MEMBER COMPRISED OF FLUORINE-CONTAINING POLYMER RESIN

[75] Inventors: Ichiro Kataoka, Tsuzuki-gun; Takahiro Mori, Ikoma; Satoru Yamada, Tsuzuki-gun; Shigenori Itoyama, Nara, all of Japan

[73] Assignee: Canon Kabushiki Kaisha, Tokyo, Japan

[21] Appl. No.: 297,829

[22] Filed: Aug. 30, 1994

[30] Foreign Application Priority Data

Aug. 31, 1993 [JP] Japan .................... 5-216048
Aug. 1, 1994 [JP] Japan .................... 6-180129

[51] Int. Cl.⁶ .................................... H01L 23/58
[52] U.S. Cl. .......................... 257/40; 257/53; 257/56; 257/434; 257/642; 136/256; 136/259; 428/423.300; 526/242
[58] Field of Search .............. 257/40, 53, 56, 257/433, 434, 642, 643; 136/256, 259; 428/423.3; 526/242

[56] References Cited

U.S. PATENT DOCUMENTS

| 4,617,057 | 10/1986 | Plueddemann | 106/2 |
| 5,021,602 | 6/1991 | Clement et al. | 558/230 |
| 5,023,380 | 6/1991 | Babb et al. | 568/34 |
| 5,037,917 | 8/1991 | Babb et al. | 526/242 |
| 5,037,918 | 8/1991 | Babb | 526/242 |
| 5,037,919 | 8/1991 | Clement et al. | 526/242 |
| 5,066,746 | 11/1991 | Clement et al. | 526/242 |
| 5,246,782 | 9/1993 | Kennedy et al. | 428/423.3 X |

FOREIGN PATENT DOCUMENTS

| 6001269 | 1/1985 | Japan . |
| 61-101083 | 5/1986 | Japan . |
| 92076229 | 12/1992 | Japan . |

Primary Examiner—William Mintel
Attorney, Agent, or Firm—Fitzpatrick, Cella, Harper & Scinto

[57] ABSTRACT

A photoelectric conversion device including a photoelectric conversion element comprising a substrate, a photoelectric conversion layer with at least a pair of electrodes disposed on said substrate, a transparent resin layer comprising a fluorine-containing polymer resin, and a transparent surface layer, said transparent resin layer being disposed between said photoelectric conversion element and said transparent surface layer, characterized in that said fluorine-containing polymer resin has a fluorine content of 20 wt. % to 40 wt. % and is crosslinked with a peroxide. A module including (a) a photoelectric conversion element comprising a substrate, a photoelectric conversion layer with at least a pair of electrodes disposed on said substrate, (b) a transparent resin layer comprising a fluorine-containing polymer resin, (c) a transparent surface layer, and (d) a reinforcing member, said transparent resin layer and said transparent surface layer being disposed in this order on the light receiving face of said photoelectric conversion element, and said reinforcing member being disposed on the rear side of said photoelectric conversion element, characterized in that said fluorine-containing polymer resin has a fluorine content of 20 wt. % to 40 wt. % and is crosslinked with a peroxide.

45 Claims, 14 Drawing Sheets

SEE FIG.6(b)

PHOTOELECTRIC CONVERSION DEVICE AND PHOTOELECTRIC CONVERSION MODULE EACH HAVING A PROTECTIVE MEMBER COMPRISED OF FLUORINE-CONTAINING POLYMER RESIN

BACKGROUND OF THE INVENTION

1. Field of the Invention

The present invention relates to an improved, reliable photoelectric conversion device and an improved, reliable photoelectric conversion module which excel in weatherability, heat resistance and abrasion resistance and continuously exhibit a desirable photoelectric conversion efficiency without being deteriorated even upon repeated use over a long period of time under severe environmental conditions of high temperature and high humidity. More particularly, the present invention relates to an improved photoelectric conversion device and an improved photoelectric conversion module each having a photovoltaic element comprising a semiconductor active layer and a transparent and conductive layer disposed in this order on an electroconductive substrate, and a surface protective member disposed on said photovoltaic element, said surface protective member including a transparent material member composed of a specific fluorine-containing polymer resin, wherein the photovoltaic element of the photoelectric conversion device or photoelectric conversion module is tightly sealed by means of the aforesaid specific surface protective member with an improved adhesion between the photovoltaic element and the surface protective member. Hence, the photoelectric conversion device or photoelectric conversion module excels in weatherability, moisture resistance, heat resistance and abrasion resistance and continuously exhibits a desirable photoelectric conversion efficiency without being deteriorated even upon repeated use over a long period of time under severe environmental conditions of high temperature and high humidity.

2. Related Background Art

In recent years, heating of the earth because of the so-called greenhouse effect due to an increase of atmospheric $CO_2$ has been predicted. In view of this, there is an increased demand for a means of power generation capable of providing clean energy without causing $CO_2$ buildup. In this regard, nuclear power generation has been considered to be advantageous in view of not causing $CO_2$ buildup. However, there are problems for nuclear power generation in that it unavoidably produces radioactive wastes which are harmful for living things and there is a probability that leakage of injurious radioactive materials from the nuclear power generation system will happen when the system is damaged. Therefore, there is an increased societal demand for early realization of a power generation system capable of providing clean energy without causing $CO_2$ buildup as in the case of thermal power generation and without causing radioactive wastes and radioactive materials as in the case of nuclear power generation.

There have been various proposals which are expected to meet such societal demand. Among those proposals, solar cells (photoelectric conversion elements in other words) are expected to be a future power generation source since they supply electric power without causing those problems as above mentioned.

There have been proposed a variety of solar cells for commercial and home appliances. These solar cells include single crystal silicon solar cells, polycrystal silicon solar cells, amorphous silicon solar cells, copper indium selenide solar cells, and compound semiconductor solar cells. Of these solar cells, various studies have been made on so-called thin film crystal silicon solar cells, compound semiconductor solar cells and amorphous silicon solar cells since their semiconductor active layer can be relatively easily formed in a large area and in a desired form and they therefore can be easily produced at a relatively low production cost.

Particularly, thin film amorphous solar cells, specifically, amorphous silicon solar cells, comprising a metal substrate, an amorphous silicon semiconductor active layer disposed on said metal substrate, and a transparent and conductive layer disposed on said semiconductor active layer have been evaluated as being the most advantageous among the conventional solar cells because their semiconductor active layer comprised of amorphous silicon (hereinafter referred to as a—Si) can be easily formed in a large area and in a desired form on a relatively inexpensive substrate with a low production cost and they are light and excel in shock resistance and flexibility, and in addition, they can be designed into a solar cell module in a desired configuration which can be used as a power generation source.

Now, in the case of an amorphous silicon solar cell having a semiconductor active layer comprising, for example, an a—Si thin film disposed on a glass plate as a substrate, light is impinged through the substrate side, and because of this, the glass plate can be designed to serve as a protective member. However, in the case of the aforementioned solar cell having the a—Si semiconductor active layer disposed on the metal substrate, because the metal substrate does not permit incident light to transmit therethrough, light is impinged through the side opposite the metal substrate, and therefore, it is necessary to dispose an appropriate transparent protective member on the side through which light is impinged such that it protects the solar cell element. In the conventional manner to do this, a transparent fluorine-containing polymer film comprised of fluororesin or a fluororesin-containing composition is used as the surface protective member and a transparent thermoplastic resin is used as a filler under the transparent fluorine-containing polymer film.

In fact, the fluorine-containing polymer film is often used in the above described manner, since it is advantageous in that it is satisfactory in terms of weatherability and water-repellency and serves to diminish a deterioration in the photoelectric conversion efficiency of the solar cell element caused due to a reduction in the transmittance of the surface protective member which occurs when the protective member is yellowed or clouded as a result of the protective member having been deteriorated. As for the thermoplastic resin used as the filler in combination with the fluorine-containing polymer film, it is also often used since it is relatively inexpensive and suitable for protecting the solar cell element.

Now, description will be made of the conventional solar cell module with reference to FIG. 1.

FIG. 1 is a schematic cross-sectional view of an example of the conventional solar cell module. In FIG. 1, reference numeral 701 indicates a transparent surface protective film comprising a fluorine-containing polymer thin film, reference numeral 702 indicates a transparent thermoplastic resin as a filler, reference numeral 703 indicates a photovoltaic element (or a solar cell), and reference numeral 704 indicates an insulating member.

In this solar cell module, the filler disposed on the rear side of the photovoltaic element 703 is comprised of the same thermoplastic resin disposed on the side through which light is impinged.

Specific examples of the fluorine-containing polymer thin film as the transparent surface protective film 701 are fluororesin films such as ETFE (ethylene-tetrafluoroethylene copolymer) film, PVF (polyvinyl fluoride) film, and the like. Specific examples of the transparent thermoplastic resin as the filler 702 are EVA (ethylene-vinyl acetate copolymer), butyral resin, and the like.

The insulating member 704 is disposed in order to reinforce the solar cell module while adding an appropriate rigidity thereto. The insulating member 704 is usually comprised of an organic resin film such as nylon film, TEDLAR (trademark name, laminated aluminum foil), or the like.

The thermoplastic resin 702 serves as an adhesive between the photovoltaic element 703 and the surface protective film 701 (that is, the fluororesin film) and also as an adhesive between the photovoltaic element and the insulating member 704. In addition to this, the thermoplastic resin 702 also serves as a filler for preventing the photovoltaic element from being externally damaged and from being damaged from external shock.

Incidentally, the present inventors made experimental studies of the thermoplastic resin as the filler in the conventional solar cell module thus constituted by way of a so-called acceleration test corresponding to exposure in outdoors over a long period of time (more than 20 years). As a result, there were obtained the following findings. That is, when the solar cell module is continuously exposed to sunlight in outdoors over a long period of time (for example, over 20 years), the thermoplastic resin as the filler is liable to suffer from gellation whereby it becomes clouded or it is liable to be yellowed due to an increase in conjugated double bonds in the chemical structure of the resin. The occurrence of such cloudiness or yellowing makes the thermoplastic resin as the filler to become poor in light transmittance, resulting in reducing the photoelectric conversion efficiency of the solar cell module. Hence, the thermoplastic resin as the filler is not sufficient enough not only in terms of weatherability but also terms of durability upon repeated use in outdoors over a long period of time (for example, over 20 years).

The present inventors also found that the above problems become significant when the solar cell module is continuously used in a severe outdoor atmosphere of high temperature and high humidity, wherein it is placed at a roof of a building or it is integrated with the roof.

Further, the present inventors noted a problem for the solar cell module in which the filler is comprised of EVA. That is, when this solar cell module is continuously used at a temperature of 80° C. or above, the filler is liable to be remarkably yellowed.

In addition, the present inventors obtained a solar cell module in which the filler is comprised of butyral resin. When this solar cell module is continuously used outdoors, moisture is liable to invade through end portions of the filler into a defective portion of the photovoltaic element since the butyral resin is relatively high in hygroscopicity. In this case, the invaded moisture and the electric field of the photovoltaic element cause the constituent metal of the collecting electrode of the photovoltaic element to become ionized to cause a precipitate, resulting in growing an independent metal layer. When this phenomenon proceeds, a short circuit occurs in the photovoltaic element wherein an electric charge produced cannot be effectively outputted, resulting in reducing the photoelectric conversion efficiency of the photovoltaic element. In addition to this, the butyral resin has an inherent problem of causing a so-called devitrification phenomenon in that its transparency is markedly reduced when it is exposed to an atmosphere of high temperature and high humidity.

Now, Japanese Laid-open patent application No. 76229/1992 (hereinafter referred to as Japanese patent document) discloses a solar cell module which is free of coloring (for example, yellowing) in the constituent resin and which is slightly deteriorated in the severe high temperature-high humidity test. The Japanese patent document describes that a protective film composed of a resin containing perfluoroalkylene group and active hydrogen (i.e., LUMIFLON (trademark name, produced by Asahi Glass Co., Ltd.)) is disposed in a CdS/CdTe type solar cell comprising a CdS/CdTe semiconductor layer disposed on a substrate. As for the LUMIFLON used, the Japanese patent document describes that it is a fluorine polymer having a number average molecular weight of 20,000 to 80,000 and containing perfluoroalkylene group and pendant active hydrogen and which can produce a crosslinked polymer when reacted with melamine or a compound having an isocyanate group (that is, a crosslinking agent). Further, the Japanese patent document describes that a protective film excelling in moisture resistance is obtained when the LUMIFLON is crosslinked with isocyanate or resol type phenol resin.

It is understood that the Japanese patent document is directed to a technique of merely disposing the aforesaid protective film on a thin film type solar cell element.

In the solar cell module described in the Japanese patent document, there still remain some problems to be resolved particularly in terms of resistance to change in environments and durability. Specifically, the formation of the foregoing protective film in the Japanese patent document is conducted by applying a coating composition containing the foregoing resin by means of a screen printing technique and hardening the coating composition applied at an elevated temperature. Because of this, it is difficult to attain a sufficient thickness for the protective film to be formed, wherein when the thin film solar cell element has an uneven surface, although the protective film can be formed along such uneven surface, the resultant is such that is accompanied by irregularities at the surface. Thus, the product is problematic in that it is not satisfactory particularly in terms of mechanical resistance since the surface thereof is liable to be externally damaged because of the irregularities present at the surface.

In view of avoiding the occurrence of such problems the use of a glass member as a protective member for a thin film solar cell element is the most appropriate. In fact, there are a number of proposals for sealing a thin film solar cell element by using a glass member. However, the glass sealing is difficult to attain desirable flexibility, shock resistance, lightweight, and production cost reductin for a solar cell module obtained.

SUMMARY OF THE INVENTION

The present invention is aimed at eliminating the foregoing problems in the conventional solar cell module and providing an improved photoelectric conversion device and an improved photoelectric conversion module.

Another object of the present invention is to provide a photoelectric conversion device and a photoelectric conversion module each having an improved surface protective member comprised of a specific fluorine-containing polymer resin wherein the photovoltaic element (or the photoelectric conversion element) is tightly sealed by means of the surface protective member in such a state that the photovoltaic element (or the photoelectric conversion element) is maintained in a desirable state without being deteriorated mainly due to moisture invasion even upon repeated use over a long period time, and which excel in weatherability, moisture resistance, heat resistance and abrasion resistance and continuously exhibit a desirable photoelectric conversion efficiency without being deteriorated even upon repeated use over a long period of time under severe environmental conditions of high temperature and high humidity.

A further object of the present invention is to provide an improved photoelectric conversion device and an improved photoelectric conversion module each having a multi-layered protecting member including at least a transparent resin layer disposed on the light incident side of the photovoltaic element (or the photoelectric conversion element) and a transparent surface protective layer disposed at the outermost surface outside said resin layer, wherein said resin layer is comprised of a specific fluorine-containing polymer resin with a fluorine content of 20 wt. % to 40 wt. %.

A further object of the present invention is to provide an improved photoelectric conversion device having a photoelectric conversion element comprising a substrate, a photoelectric conversion layer disposed on said substrate, and at least a pair of electrodes disposed at said photoelectric conversion layer, a transparent resin layer and a transparent surface protective layer respectively disposed on the light incident side of said photoelectric conversion element, wherein said resin layer is interposed between said photoelectric conversion element and said surface protective layer, and said resin layer is comprised of a specific fluorine-containing polymer resin with a fluorine content of of 20 wt. % to 40 wt. % and which is crosslinked with a peroxide.

A further object of the present invention is to provide an improved photoelectric conversion module having a photoelectric conversion element comprising a substrate, a photoelectric conversion layer disposed on said substrate, and at least a pair of electrodes disposed at said photoelectric conversion layer, a transparent resin layer having a multi-layered structure and a transparent surface protective layer respectively disposed on the light incident side of said photoelectric conversion element, and a back face reinforcing member, wherein said resin layer is interposed between said photoelectric conversion element and said surface protective layer, and said resin layer is comprised of a specific fluorine-containing polymer resin with a fluorine content of 20 wt. % to 40 wt. % and which is crosslinked with a peroxide.

A further object of the present invention is to provide an improved photoelectric conversion device having a photoelectric conversion element comprising a substrate, a photoelectric conversion layer disposed on said substrate, and at least a pair of electrodes disposed at said photoelectric conversion layer, a transparent resin layer and a transparent surface protective layer respectively disposed on the light incident side of said photoelectric conversion element, wherein said resin layer is interposed between said photoelectric conversion element and said surface protective layer, and said resin layer is comprised of a specific fluorine-containing polymer resin with a fluorine content of 20 wt. % to 40 wt. % but containing neither a crosslinking agent nor a crosslinking assistant.

A further object of the present invention is to provide an improved photoelectric conversion module having a photoelectric conversion element comprising a substrate, a photoelectric conversion layer disposed on said substrate, and at least a pair of electrodes disposed at said photoelectric conversion layer, a transparent resin layer having a multi-layered structure and a transparent surface protective layer respectively disposed on the light incident side of said photoelectric conversion element, and a back face reinforcing member, wherein said resin layer is interposed between said photoelectric conversion element and said surface protective layer, and said resin layer is comprised of a specific fluorine-containing polymer resin with a fluorine content of 20 wt. % to 40 wt. % but containing neither a crosslinking agent nor a crosslinking assistant.

BRIEF DESCRIPTION OF THE DRAWINGS

FIGS. 6(a) and 6(b) are schematic explanatory view for an example of a solar cell module in which the present invention can be applied, wherein FIG. 6(a) is a schematic perspective view of said solar cell module, and FIG, 6(b) is a schematically enlarged view of a bent portion of said solar cell module.

DESCRIPTION OF THE INVENTION AND PREFERRED EMBODIMENTS

Figure 1:
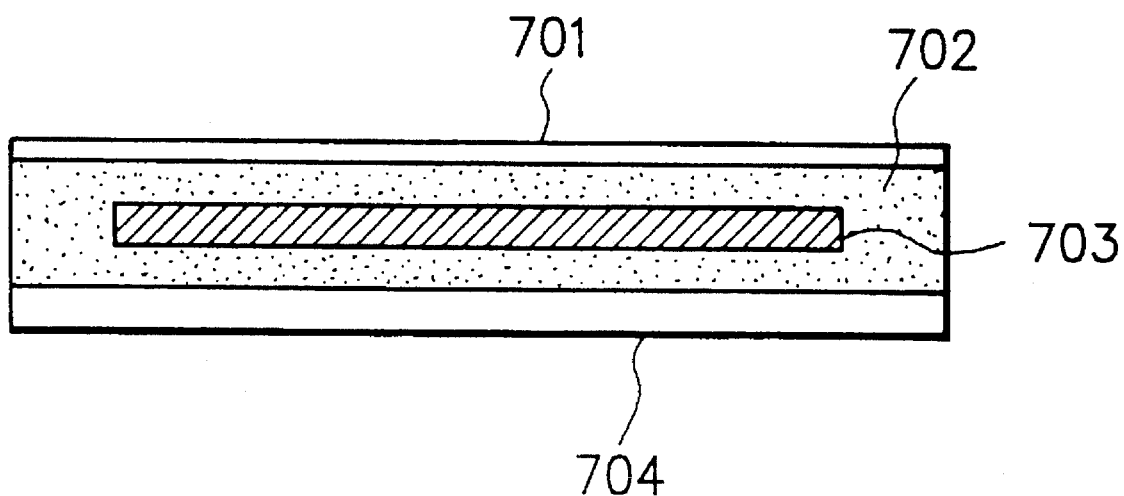
FIG. 1 is a schematic cross-sectional view illustrating the constitution of a conventional solar cell module.

The present invention is to eliminate the foregoing problems in the prior art and to attain the above described objects. The present invention provides an improved photoelectric conversion device and an improved photoelectric conversion module each having a photoelectric conversion element such as a photovoltaic element which is tightly sealed by a multi-layered protecting member including a transparent resin layer disposed on the light incident side of said photovoltaic element and a transparent surface protective layer disposed at the outermost surface outside said resin layer, wherein said resin layer is comprised of a specific fluorine-containing polymer resin with a fluorine content of 20 wt. % to 40 wt. %.

The photoelectric conversion device and photoelectric conversion module according to the present invention have such significant advantages as will be described below, because their photoelectric conversion element is tightly sealed by means of a transparent resin layer comprised of a specific fluorine-containing polymer resin with a fluorine content of 20 wt. % to 40 wt. % (this resin will be hereinafter occasionally referred to as fluororesin) and a transparent surface protective layer disposed above said transparent resin layer.

(1) There can be attained a surface coating (or a filler) excelling in weatherability. That is, because the specific fluororesin containing fluorine in a specific amount of 20 wt. % to 40 wt. % is used as a protective layer for the photoelectric conversion element, there can be attained a surface coating essentially excelling in weatherability. Particularly, such yellowing problem as found in the prior art in which EVA is used as a protective member for the photoelectric conversion element does not occur even upon repeated use over a long period of time, wherein the photoelectric conversion element is effectively prevented from being deteriorated in terms of photoelectric conversion efficiency.

(2) There can be attained a surface coating (or a filler) excelling in moisture resistance. That is, because the specific fluororesin containing fluorine in a specific amount of 20 wt. % to 40 wt. % is used as a protective layer for the photoelectric conversion element, there can be attained a surface coating essentially excelling in moisture resistance. Particularly, there is freedom from the problem found in the prior art using polyvinyl butyral resin as a protective member for the photoelectric conversion element wherein the protective member permits moisture invasion into the photoelectric conversion element under environmental conditions of high temperature and high humidity. Hence, in the present invention, the photoelectric conversion element is free of moisture invasion even under environmental conditions of high temperature and high humidity and because of this, a short circuit hardly occurs in the photoelectric conversion element. In addition to this, there is no occurrence of the transparency reduction problem due to the devitrification phenomenon found in the prior art of using polyvinyl butyral resin as a protective member for the photoelectric conversion element, and therefore, there is no occurrence of a loss in the quantity of light impinged into the photoelectric conversion element which results in reducing the photoelectric conversion efficiency of the photoelectric conversion element.

(3) When the fluororesin comprises a copolymer of fluoroethylene and vinyl monomer units as the principal constituent, there can be attained a surface coating (or a filler) which desirably functions as a filler while taking full advantages of the fluororesin. Particularly, the surface coating excels in weatherability and moisture resistance and which is imported with various properties provided by the vinyl monomer unit such as fusibility to solvents, transparency, flexibility, crosslinking property, and adhesion.

When the above fluoroethylene is replaced by chlorotrifluoroethylene, there can be attained a surface coating having a relatively low glass transition point and which is flexible and excels especially in transparency, because the fluororesin is poor in crystallinity due to a steric hindrance caused by the chlorine atoms.

(4) When the copolymer described in the above (3) is one which has been crosslinked with a peroxide, there can be attained a surface coating (or filler) excelling especially in heat resistance. Particularly, during repeated use in an atmosphere of relatively high temperature, the coating material (or the filler) is softened, wherein it is prevented from being removed from the photoelectric conversion element. In addition to this, the coating material is free of such problems found in the prior art of using EVA as a protective member for the photoelectric conversion element in that the EVA as the protective member is liable to yellow during repeated use and this tendency is apparent in the case where an antioxidant and the like contained in the EVA as the protective member is evaporated during repeated use in an atmosphere of relatively high temperature, resulting in causing a reduction in the photoelectric conversion efficiency of the photoelectric conversion element.

(5) When the copolymer described in the above (4) is made to have an acid value of 2 or more, there can be attained a surface coating (or a filler) excelling especially in adhesion. Particularly, even upon repeated use under severe environmental conditions wherein the temperature suddenly lowered or heightened, a removal is hardly occurs not only at the interface between the coating (or the filler) and the surface protective layer (that is, the outermost surface layer) but also at the interface between the coating (or the filler) and the photoelectric conversion element.

(6) There can be attained a surface coating (or a filler) excelling especially in moisture resistance by making the copolymer prior to subjecting to the crosslinking in the above (4) to be 50 or less in hydroxyl value. That is, by using no hydroxyl group as a crosslinking point upon crosslinking the copolymer, the hydroxyl value of the copolymer prior to the crosslinking can be reduced to be low in hydroxyl value. By using a fluororesin obtained in this case, there can be attained a surface coating (or a filler) excelling especially in moisture resistance.

Incidentally, as for the conventional solvent-soluble type fluororesin coating composition, it is usually crosslinked while utilizing its hydroxyl groups with the use of a crosslinking agent such as isocyanate or melamine. However, the product obtained in this case unavoidably contains a hydrophilic urethane bond or urea bond, and because of this, there cannot be attained a surface coating (or a filler) essentially excelling in moisture resistance by using this product.

(7) When the vinyl monomer unit of the copolymer described in the above (3) includes vinyl ether having a long chain alkyl group in the side chain, there can be attained a surface coating (or a filler) which excels especially in flexibility. Particularly, by structurally having such vinyl ether with a long chain alkyl group in the side chain, the copolymer becomes to have a reduced glass transition point, and this leads to providing a surface coating (or filler) excelling in flexibility.

(8) When the vinyl monomer unit of the copolymer described in the above (3) includes vinyl ester having a long chain alkyl group in the side chain, there can be attained a surface coating (or a filler) which excels especially in both flexibility and adhesion. Particularly, by structurally having such vinyl ester with a long chain alkyl group in the side chain, the copolymer becomes to have a reduced glass transition point, and this leads to providing a surface coating (or filler) excelling in flexibility. In addition this, an improvement can be attained not only in the adhesion between the coating (or the filler) and the photoelectric conversion element but also in the adhesion between the coating (or the filler) and the surface protective layer (or the outermost surface layer).

In the case where the surface coating (or the filler) is incorporated with a coupling agent, a further improvement can be attained not only in the adhesion between the coating (or the filler) and the photoelectric conversion element but also in the adhesion between the coating (or the filler) and the surface protective layer (or the outermost surface layer).

In addition to these advantages described in the above (1) through (8) provided by using such specific fluororesin as a transparent protective layer or filler which serves to encapsulate the photoelectric conversion element, other advantages are provided by designing the transparent surface layer disposed on the fluororesin layer as will be described below.

(a) When the transparent surface protective layer is comprised of a resin film of 70° or above in surface contact angle against water, there can be attain a photoelectric conversion device or module having a desirable surface capable of preventing pollution and capable of preventing deposition with pollutants, wherein the photoelectric conversion device or module is free of a reduction in the photoelectric conversion efficiency.

(b) When the transparent surface protective layer comprises a transparent film composed of a fluoropolymer, there can be attained a photoelectric conversion device or module which markedly excels in weatherability because the transparent surface protective layer excels in weatherability and in addition to this, the coating material (or the filler) composed of the foregoing specific fluororesin for the photoelectric conversion element also excels in weatherability.

(c) When the transparent surface protective layer comprises a film composed of tetrafluoroethylene-ethylene copolymer, there can be attained a photoelectric conversion device or module which is markedly improved in terms of weatherability, transparency, and physical strength.

(d) When corona discharging treatment is conducted for the face of the transparent surface protective layer to be joined to the coating material (or the filler) composed of the foregoing specific fluororesin for the photoelectric conversion element, the adhesion between the two can be further assured.

(e) When the transparent surface protective layer comprises a nonoriented (or nondrawn) resin film, there can be attained a photoelectric conversion module (or a solar cell module) which can be properly designed as desired in terms of shape. Particularly, this photoelectric conversion module is free of crazings or pinholes when it is bent in order for it to be shaped as desired, wherein the bent photoelectric conversion module obtained has a desirable surface without crazing or pinhole and which excels in moisture resistance and pollution resistance.

In the following, the present invention will be described in more detail.

Firstly, description will be made of the protective film described in the foregoing Japanese patent document (i.e., Japanese Laid-open patent application No. 76229/1992). The protective film described in the Japanese patent document has such problems as previously described because it is formed by means of the coating technique, although its basic property is satisfactory. In order to eliminate such problems relating to the protective film in the Japanese patent document, there can be considered a manner wherein the protective film is used as a coating material (or a filler) for the solar cell element and a separate film is disposed thereon whereby attaining an improvement for the solar cell module in terms of weatherability and durability. However, this manner is not practical because it is extremely difficult to laminate an appropriate resin film as a surface protective film at a satisfactory adhesion on the resin containing perfluoroalkylene group and active hydrogen previously applied by means of the coating technique, aiming at attaining an improvement in terms of weatherability and durability.

Incidentally, in the case of crosslinking a copolymer, there is usually added a crosslinking agent. In the Japanese patent document, there is described the addition of isocyanate as a crosslinking agent. In any case, the pot life of a resin after having been mixed with a crosslinking agent is short in general (the pot life herein means a period of time during which the resin can be used as a coating material). In this respect, in order to prolong the the pot life, a blocking agent is usually added to protect a crosslinking agent (for example, isocyanate) from reacting.

However, in the case of the above manner of forming a coat structure by laminating a surface protective film on the resin containing perfluoroalkylene group and active hydrogen previously applied by means of the coating technique, crosslinking of the resin is difficult to be attained as desired because a blocking agent contained in the resin is not sufficiently dissociated and vaporized upon the crosslinking operation due to the surface film covering the resin, wherein the crosslinking reaction does not proceed as desired. In order to avoid occurrence of this problem, there can be considered a manner wherein the resin is firstly crosslinked and then, the surface film is laminated on the resultant crosslinked resin. This manner is however not effective because the crosslinked resin is poor in adhesion and therefore, there cannot be attained a practically acceptable laminate.

Further, in the case of using melamine as a crosslinking agent, there is not available any effective blocking agent therefor.

In view of the above description, it is understood that the resin containing perfluoroalkylene group and active hydrogen in the Japanese patent document is effective only in using as an outermost surface protective member but is not usable as a filler in a solar cell module.

Now, the resin containing perfluoroalkylene group and active hydrogen in the Japanese patent document is of a surface hardness corresponding to a pencil hardness of B to H. The surface of the resin with such surface hardness is readily damaged by sand or dust in the outdoors, wherein the surface being damaged is readily polluted through the damaged or/and is deposited with dust or sand at the damaged portions, resulting in scattering sunlight or preventing sunlight from being impinged.

Although the situation will be somewhat different depending on the application manner employed, in any case, when a coating composition comprising the resin containing perfluoroalkylene group and active hydrogen described in the Japanese patent document is provided and the coating composition is applied to form a surface film upon preparing a solar cell module, the resulting surface film becomes pinholed and is readily deposited with dust, which permits moisture or oxygen to invade into the solar cell element.

Therefore, it can be said that a practically effective organic material capable of providing a surface coating (or a filler) capable of encapsulating a photoelectric conversion element in a state excelling especially in weatherability and moisture resistance in the production of a photoelectric conversion device or module is not available at the present time.

The present inventors made extensive studies in order to eliminate the foregoing problems in the prior art. As a result, there was obtained a finding that those fluorine-containing polymer resins with a fluorine content of 20 wt. % to 40 wt. % as above described are effective in attaining a surface coating (or a filler) capable of encapsulating a photoelectric conversion element in a state excelling especially in weatherability and moisture resistance in the production of a photoelectric conversion device or module, wherein the resulting photoelectric conversion device or module is free of the foregoing problems in the prior art.

Figure 2:
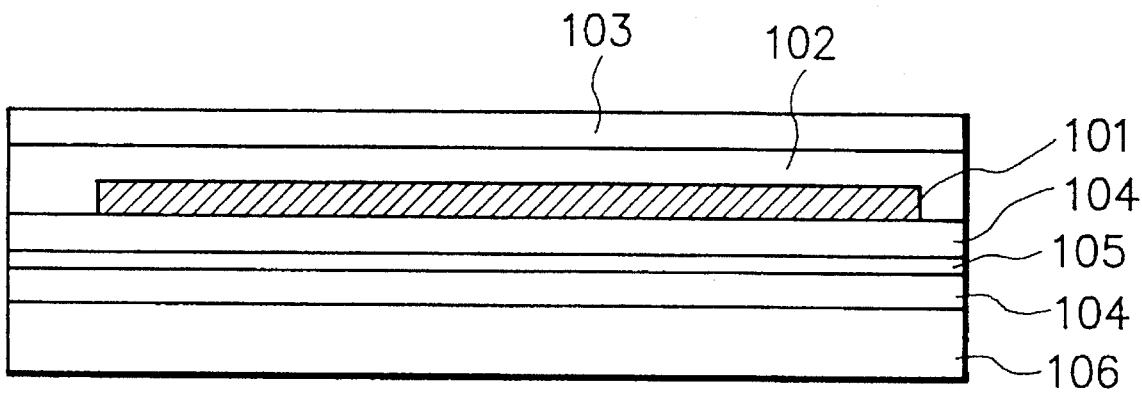
FIG. 2 is a schematic cross-sectional view illustrating the constitution of an example of a solar cell module according to the present invention.

FIG. 2 is a schematic cross-sectional view illustrating the constitution of an example of a solar cell module according to the present invention.

In FIG. 2, reference numeral 101 indicates a photovoltaic element (or a photoelectric conversion element), reference numeral 102 a transparent or substantially transparent filler (this filler will be hereinafter referred to as surface side filler), reference numeral 103 a transparent or substantially transparent film which is positioned at the outermost surface (this film will be hereinafter referred to surface protective film or surface protective layer), reference numeral 104 a filler on the rear side of the photovoltaic element 101 (this filler will be hereinafter referred to as backside filler), reference numeral 105 a back face protective film, and reference numeral 106 a back face reinforcing member.

In the solar cell module shown in FIG. 2, light is impinged through the outermost surface film 103, and the light impinged passes through the outermost surface film 103 and filler 102 to arrive in the photovoltaic element 101. A photoelectromotive force generated in the photovoltaic element 101 is outputted through outputting terminals (not shown).

Figure 3A:
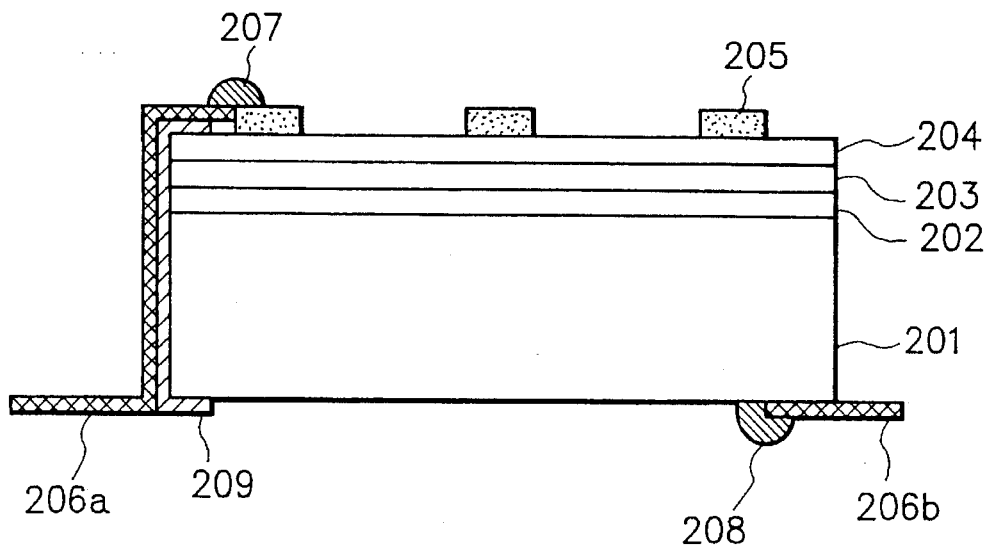
FIG. 3(a) is a schematic cross-sectional view illustrating the constitution of an example of a photoelectric conversion element which can be used in the present invention.
Figure 3B:
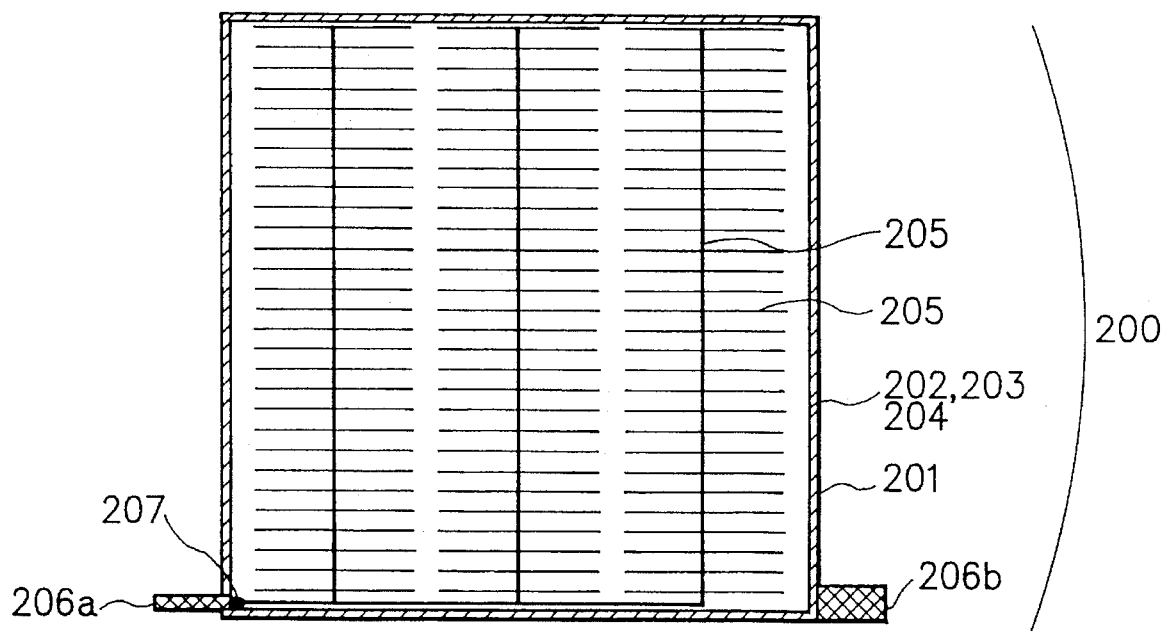
FIG. 3(b) is a schematic plan view illustrating a light receiving face of the photoelectric conversion element shown in FIG. 3(a).

The photovoltaic element 101 comprises at least a semiconductor active layer as a photoelectric conversion member disposed on an electroconductive substrate. FIG. 3(a) is a schematic cross-sectional view illustrating the constitution of such photovoltaic element. FIG. 3(b) is a schematic plan view illustrating the light receiving face of the photovoltaic element shown in FIG. 3(a).

In FIGS. 3(a) and 3(b), reference numeral 200 indicates the entire of a photoelectric conversion element (or a photovoltaic element), reference numeral 201 an electroconductive substrate, reference numeral 202 a back reflecting layer, reference numeral 203 a semiconductor active layer, reference numeral 204 a transparent and conductive layer, reference numeral 205 a collecting electrode (or a grid electrode), reference numeral 206a a power outputting terminal on the positive side, reference numeral 206b a power outputting terminal on the negative side, reference numeral 207 an electroconductive adhesive, reference numeral 208 a solder, and reference numeral 209 an insulating member.

As apparent from FIGS. 3(a) and 3(b), the photoelectric conversion element 200 comprises the back reflecting layer 202, the semiconductor active layer 203, the transparent and conductive layer 204, and the collecting electrode 205 disposed in this order on the electroconductive substrate 201, wherein the outputting terminal 206a is electrically connected to the collecting electrode 205 by means of the electroconductive adhesive 207 and it is extending from the collecting electrode while being insulated by means of the insulating member 209, and the outputting terminal 206b is electrically connected to the electroconductive substrate 201 by means of the solder 208. In this configuration, the positive side power outputting terminal and the negative side power outputting terminal may be changed into a negative side power outputting terminal and a positive side power outputting terminal depending upon the constitution of the semiconductor active layer.

The electroconductive substrate 201 serves not only as a substrate for the photovoltaic element and also as a lower electrode. As for the electroconductive substrate 201, there is no particular restriction as long as it has an electroconductive surface. Specifically, it may be an electroconductive member composed of a metal such as Ta, Mo, W, Al, Cu, Ti, or the like, or an electroconductive member composed of an alloy such as stainless steel, or the like. Other than these, the electroconductive substrate may comprise a carbon sheet or a Pb-plated steel sheet. Alternatively, the electroconductive substrate may be a film or sheet made of a synthetic resin or a sheet made of a ceramic. In this case, the substrate is deposited with an electroconductive film on the surface thereof.

The back reflecting layer 202 disposed on the electroconductive substrate 201 may comprise a metal layer, a metal oxide layer, or a two-layered structure comprising a metal layer and a metal oxide layer. The metal layer may be composed of a metal such as Ti, Cr, Mo, W, Al, Ag, Ni, or the like. The metal oxide layer may comprise any of oxides of said metals, or other metal oxide such as ZnO, $SnO_2$, or the like.

The back reflecting layer 202 is desired to have a roughened surface in order to make incident light to be effectively utilized.

The back reflecting layer 202 may be properly formed by a conventional film-forming technique such as resistant heating evaporation, electron beam evaporation, or sputtering.

The semiconductor active layer 203 functions to conduct photoelectric conversion. The semiconductor active layer may be composed of a single crystal silicon semiconductor material, a non-single crystal silicon semiconductor material such as an amorphous silicon semiconductor material or polycrystalline silicon semiconductor material, or a compound semiconductor material. In any case, the semiconductor active layer comprised of any of these semiconductor materials may be of a stacked structure with a pin junction, a pn junction or a Schottky type junction. Specific examples of the compound semiconductor material are copper-indium-selenide, GaAs, $CdS/Cu_2S$, CdS/CdTe, CdS/InP, $CdTe/Cu_2Te$, and the like.

The semiconductor active layer comprised of any of the above mentioned semiconductor materials may be properly formed by a conventional film-forming technique. For instance, the non-single crystal silicon semiconductor active layer may be formed by a conventional chemical vapor phase growing technique such as plasma CVD or light-induced CVD using proper film-forming raw material gas capable of imparting silicon atoms such as silane gas or a conventional physical vapor phase growing technique such as sputtering using a Si-target. The semiconductor active layer composed of a polycrystalline silicon semiconductor material may be formed by a conventional polycrystalline silicon film-forming manner of providing a fused silicon material and subjecting the fused silicon material to film-making processing or another conventional polycrystalline silicon film-forming manner of subjecting an amorphous silicon material to heat treatment.

The semiconductor active layer composed of any of the above mentioned compound semiconductor materials may be properly formed by a conventional ion plating, ion beam deposition, vacuum evaporation, sputtering, or electrolytic technique in which a precipitate is caused by way of electrolysis of a desired electrolyte.

The transparent and conductive layer 204 functions as an upper electrode. The transparent and conductive layer may comprise $In_2O_3$, $SnO_2$, ITO ($In_2O_3$—$SnO_2$), ZnO, $TiO_2$, or $Cd_2SnO_4$. Other than this, it may comprise a crystalline semiconductor layer doped with an appropriate impurity with a high concentration.

The transparent and conductive layer constituted by any of the above mentioned materials may be properly formed by a conventional resistant heating evaporation, electron beam evaporation, sputtering, spraying, or CVD.

The above described impurity-doped crystalline semiconductor layer as the transparent and conductive layer may be properly formed by a conventional impurity-diffusion film-forming method.

The collecting electrode (or the grid electrode) 204 serves to effectively collect an electric current generated by virtue of a photoelectromotive force on the transparent and conductive layer 204. The collecting electrode is desired to be in the form of a comb shape.

The collecting electrode may comprise a metal such as Ti, Cr, Mo, W, Al, Ag, Ni, Cu, Sn, or an alloy of these metals. Alternatively, the collecting electrode may be formed of an electroconductive paste. The electroconductive paste can include electroconductive pastes comprising powdery Ag, Au, Cu, Ni, or carbon dispersed in an appropriate binder resin. The binder resin herein can include polyester, epoxy resin, acrylic resin, alkyd resin, polyvinyl acetate, rubber, urethane resin, and phenol resin.

The collecting electrode may be properly formed by a conventional sputtering using a mask pattern, resistant heating evaporation, or CVD. It may be also properly formed by a manner of depositing a metal film over the entire surface and subjecting the metal film to etching treatment to form a desired pattern, a manner of directly forming a grid electrode pattern by means of light-induced CVD, or a manner of forming a negative pattern corresponding to a grid electrode pattern and subjecting the resultant to plating treatment. The formation of the collecting electrode using the above described electroconductive paste can be conducted by subjecting the electroconductive paste to screen printing.

The outputting terminals 206a and 206b serve to output an electromotive force. The outputting terminal 206a is electrically connected to the collecting electrode 205 by means of the electroconductive paste 207 in FIG. 3(a). Alternatively, the electrical connection in this case may be conducted by using an appropriate connecting metal body and an electroconductive paste or solder.

The outputting terminal 206b is electrically connected to the electroconductive substrate by means of the solder 208 in FIG. 3(A). Alternatively, the electrical connection in this case may be conducted by spot welding or soldering an appropriate metal body such as copper tab.

There are provided a plurality of photovoltaic elements having the above constitution, and they are integrated in series connection or in parallel connection depending upon a desired voltage or electric current. It is possible to dispose the integrated body on an insulating member such that a desired voltage or electric current can be obtained.

Now, the back face protective film 105 in FIG. 2 is used for the purpose of electrically isolating the electroconductive substrate 201 of the photovoltaic element from external materials including the back face reinforcing member. The back face protective film 105 is desired to be composed of a material capable of sufficiently electrically isolating the electroconductive substrate and which excels in durability, withstands a thermal expansion and thermal contraction, and excels in flexibility. Specific examples of such material are nylon, polyethylene terephtharate (PET), and the like.

The backside filler 104 serves to ensure the adhesion between the photovoltaic element 101 and the back face protective film. The backside filler 104 is desired to comprise a material capable of sufficiently ensuring the adhesion between the electroconductive substrate of the photovoltaic element and the back face protective film and which excels in durability, withstands a thermal expansion and thermal contraction, and excels in flexibility. Specific examples of such material are hot-melt materials such as EVA (ethylene-vinyl acetate copolymer) and polyvinyl butyral, and epoxy adhesives. Other than these, double-coated tapes may be also used. When the solar cell module is integrated to a roof of a building in order to use in outdoors, it is desired to use a material capable of being crosslinked as the backside fill in order to attain a sufficient adhesion between the electroconductive substrate of the photovoltaic element and the back face protective film so that the solar cell module can endure upon repeated use at high temperature. Incidentally, EVA can be crosslinked with the use of an organic peroxide.

The back face reinforcing member 106 is disposed outside the back face protective film as shown in FIG. 2, for the purposes of improving the mechanical strength of the solar cell module and preventing the solar cell module from being distorted or warped due to a change in the environmental temperature. The back face reinforcing member may comprise a steel plate, a plastic plate, or a fiberglass reinforced plastic plate (or a so-called FRP plate).

In the following, description will be made of the surface side filler 102 used in the present invention.

The surface side filler 102 serves to coat the irregularities at the surface of the photovoltaic element with a specific fluororesin and to attain a sufficient adhesion for the surface protective film. Thus, the surface side filler is required to excel especially in weatherability, adhesion, and heat resistance. In order for the surface side filler to meet these requirements, the surface side filler is comprised of a fluorine-containing polymer resin with a fluorine content of 20 wt. % to 40 wt. %. In the case of using a fluorine-containing polymer resin with a fluorine content of less than 20 wt. % as the surface side filler, a sufficient weatherability is hardly attained. On the other hand, in the case of using a fluorine-containing polymer resin with a fluorine content exceeding 40 wt. % as the surface side filler, it is difficult to attain a sufficient adhesion with the transparent and conductive layer (the upper electrode) and collecting electrode of the photoelectric conversion element and also with the surface protective film disposed on the surface side filler, wherein there is a fear that the resulting solar cell module becomes poor in reliability. Particularly, in this case, a removal is liable to occur at the interface between the surface side filler and aforesaid electrodes or at the interface between the surface side filler and the surface protective film upon repeated use over a long period of time, wherein moisture is liable to invade through such removed portion to arrive at the photovoltaic element, resulting in reducing the photoelectric conversion efficiency of the photovoltaic element. Further in addition in this case, there is a problem in that heating at an elevated temperature of 240° C. or above is necessary upon heat-bonding such fluororesin to be the surface side filler, wherein the photovoltaic element is liable to be damaged because of such high temperature heating.

In the case of using a fluorine-containing polymer resin with a fluorine content of 25 wt. % to 35 wt. % as the surface side filler, this fluororesin can be effectively heat-bonded at a relatively low temperature to coat the photovoltaic element without imparting any damage thereto, wherein the photovoltaic element is encapsulated by the fluororesin with an improved adhesion and in a state excelling in weatherability.

Specifically, the surface side filler in the present invention is principally comprised of a fluorine-containing polymer resin comprising a copolymer of fluoroethylene and vinyl monomer.

Specific examples of such copolymer are those copolymers comprising chlorotrifluoroethylene and vinyl monomer which have the following structural formula (I):

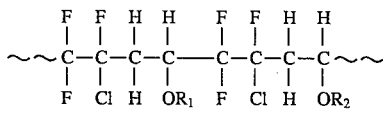

wherein $R_1$ and $R_2$ are each an alkyl group.

The fluorine content X(F)(wt. %) can be obtained by the following equation: $X(F)=(AW(F))\times N(F)/MW)\times 100$, wherein AW(F) denotes the atomic weight of fluorine atom, N(F) the number of fluorine atoms per a repeating unit, and MW the molecular weight of the repeating unit.

The vinyl monomer as the copolymerization monomer can include vinyl ether monomer and vinyl ester monomer.

The side chain group of the vinyl ether monomer can include methyl group, ethyl group, propyl group, n-butyl group, 2-butyl group, t-butyl group, n-hexyl group, and cyclohexyl group. Similarly, the side chain group of the vinyl ester monomer can include those alkyl groups mentioned in the case of the side chain group of the vinyl ether monomer.

Incidentally, in the case of a copolymer comprising chlorotrifluoroethylene and vinyl ether monomer, it is known that an alternating copolymerization occurs notwithstanding the amount of the monomer (prior to polymerization) to be added. In view of this, in order to attain a desirable flexibility for the copolymer, it is effective for the side chain group of the vinyl ether monomer to be of a long chain alkyl group of 4 or more carbon atoms or a cyclohexyl group which is large in steric hindrance.

In order to make the copolymer to have a desirable flexibility and an improved adhesion with the photovoltaic element and also with the surface protective film, it is desired that the vinyl monomer comprises vinyl ester monomer.

In the present invention, in order to crosslink the foregoing fluorine-containing polymer resin (the fluororesin) as the surface side filler, an appropriate organic peroxide is used as a crosslinking agent. The crosslinking of the fluororesin with the organic peroxide is performed by way of drawing hydrogen atoms in the fluororesin by virtue of free radicals generated from the organic peroxide to form C—C bonds. The fluororesin thus crosslinked has such a structure as represented by the following structural formula (II):

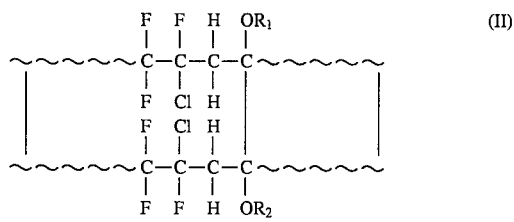

wherein $R_1$ and $R_2$ are each an alkyl group.

In order to make the organic peroxide to generate such free radicals upon crosslinking the fluororesin, the organic peroxide is activated by means of the thermal decomposition process, redox decomposition process, or ion decomposition process. Of these processes, the thermal decomposition process is the most appropriate.

The organic peroxide usable in the present invention can include hydroperoxide, dialkyl (diallyl) peroxide, diacyl peroxide, peroxyketal, peroxyester, peroxycarbonate, and ketone peroxide.

Specific examples of the hydroperoxide are t-butyl hydroperoxide, 1,1,3,3-tetramethylbutyl hydroperoxide, p-menthane hydroperoxide, cumene hydroperoxide, p-cymene hydroperoxide, diisopropylbenzene hydroperoxide, 2,5-dimethylhexane-2,5-dihydroperoxide, cyclohexane hydroperoxide, and 3,3,5-trimethylhexanone hydroperoxide.

Specific examples of the dialkyl (diallyl) peroxide are di-t-butyl peroxide, dicumyl peroxide, and t-butylcumyl-α-peroxide.

Specific examples of the diacyl peroxide are diacetyl peroxide, dipropionyl peroxide, diisobutyryl peroxide, dioctanoyl peroxide, didecanoyl peroxide, dilauroyl peroxide, bis(3,3,5-trimethylhexanoyl)peroxide, benzoyl peroxide, m-toluyl peroxide, p-chlorobenzoyl peroxide, 2,4-dichlorobenzoyl peroxide, and peroxysuccinic acid.

Specific examples of the peroxyketal are 2,2-di-t-butylperoxybutane, 1,1-di-t-butylperoxycyclohexane, 1,1-di-(t-butylperoxy)- 3,3,5-trimethylcyclohexane, 2,5-dimethyl- 2,5-di(t-butylperoxy)hexane, 2,5-dimethyl-2,5-di(t-butylperoxy)hexin- 3,1,3-di(t-butylperoxyisopropyl)benzene, 2,5-dimethyl-2,5-dibenzoylperoxyhexane, 2,5-dimethyl-2,5-di(peroxybenzoyl)hexin- 3, and n-butyl-4,4-bis(t-butylperoxy)valerate.

Specific examples of the peroxyester are t-butylperoxy acetate, t-butylperoxyisobutylate, t-butylperoxypivalate, t-butylperoxyneodecanoate, t-butylperoxy- 3,3,5-trimethylhexanoate, t-butylperoxy-2-ethylhexanoate, (1,1,3,3-tetramethylbutylperoxy)-2-ethylhexanoate, t-butylperoxylaurate, t-butylperoxybenzoate, di(t-butylperoxy)adipate, 2,5-dimethyl-2,5-di(peroxy-2-ethylhexanoyl)hexane, di(t-butylperoxy)isophthalate, t-butperoxymaleate, and acetylcyclohexylsulfonylperoxide.

Specific examples of the peroxycarbonate are t-butylperoxyisopropylcarbonate, di-n-propylperoxydicarbonate, di-sec-butylperoxydicarbonate, di(isopropylperoxy)dicarbonate, di(2-ethylhexylperoxy)dicarbonate, di(2-ethoxyethylperoxy)dicarbonate, di(methoxypropylperoxy)carbonate, di(3-methoxybutylperoxy) dicarbonate, and bis-(4-t-butylcyclohexylperoxy)dicarbonate.

Specific examples of the ketone peroxide are acetylacetone peroxide, methyl ethyl ketone peroxide, methylisobutyl ketone peroxide, and cyclohexanone peroxide.

Other than these compounds, vinyltris(t-butylperoxy)silane may be also used.

The amount of such organic peroxide as the crosslinking agent to be added to the foregoing fluorine-containing polymer resin (the fluororesin) as the filler (that is, the surface side filler) is desired to be preferably in the range of from 0.5 wt. % to 5 wt. %, more preferably in the range of from 1 wt. % to 3 wt. %, or most preferably in the range of from 1 wt. % to 2 wt. %, versus the amount of the fluorine-containing polymer resin. In the case where the amount of the organic peroxide added is less than 0.5 wt. %, the filler is not sufficiently crosslinked. In this case, the filler is liable to deform due to heat applied, wherein the filler is difficult to be maintained in a desired form. On the other hand, in the case where the amount of the organic peroxide added exceeds 5 wt. %, a certain amount of not only the organic peroxide but also decomposed products thereof is liable to remain in the filler, resulting in making the filler to be insufficient in terms of heat resistance and weatherability (light resistance).

The organic peroxide as the crosslinking agent may be used together with the fluorine-containing polymer resin (the fluororesin) as the filler upon thermocompression bonding the filler, wherein the filler is bonded to the photovoltaic element and also to the surface protective film while being crosslinked with the organic peroxide. Conditions of the temperature and the period of time for the thermocompression bonding treatment in this case may be properly determined depending upon the thermodecomposition temperature property of the organic peroxide used. However, in general, these conditions are properly determined to be such that 90% or more or preferably, 95% or more of the organic peroxide in the filler is thermally decomposed, wherein the filler is subjected to themocompression bonding to the photovoltaic element and to the surface protective film while being crosslinked.

The crosslinked degree of the filler can be examined by observing the gel content of the filler. In order to prevent the filler from being deformed, it is desired for the filler to be crosslinked such that the gel content is 70 wt. % or more.

In order to efficiently crosslink the filler, it is desired to use a crosslinking assistant such as triarylcyanurate in addition to the organic peroxide as the crosslinking agent. In this case, the amount of the crosslinking assistant to be added to be in the range of from 1 wt. % to 5 wt. % versus the amount of the filler.

Further, it is possible to incorporate an acid component into the filler. In this case, a further improvement is provided in the adhesion of the filler with the photovoltaic element and also with the surface protective film. The introduction of such acid component can be conducted by a manner of copolymerizing the foregoing copolymer with a third component comprising an appropriate acid substance or a manner using a separate acid-containing resin or oligomer. In the former manner, when the foregoing fluorine-containing polymer resin (comprising the foregoing copolymer) does not have a hydroxyl group in the side chain thereof, there can be used (metha)acrylic acid, maleic acid, fumaric acid, or oleic acid as the acid substance. And when the foregoing fluorine-containing polymer resin (comprising the foregoing copolymer) has a hydroxyl group in the side chain thereof, said acids form an acetal group with the hydroxyl group, and because of this, it is desired to use not such acid but an appropriate dibasic acid anhydride capable of introducing an acid component into the filler without causing the formation of such acetal group. Specific examples of such dibasic acid anhydride are oxalic anhydride, malonic anhydride, succinic anhydride, glutaric anhydride, and adipic anhydride.

As the acid-containing resin in the latter manner, there can be used styrene-maleic anhydride copolymer, or (metha)acrylic acid-copolymerized resins.

Figure 4:
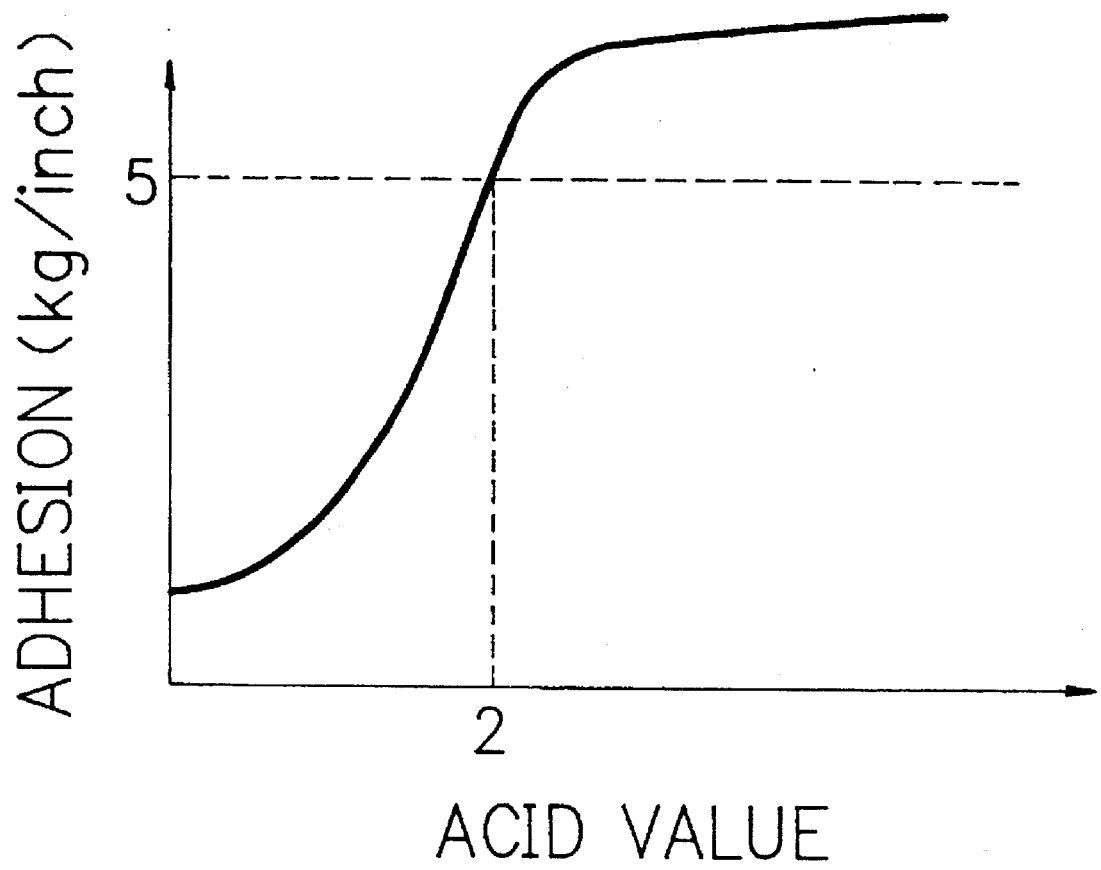
FIG. 4 is a graph showing the interrelation between adhesion and acid value for a composite of EFTE film applied with corona discharging treatment and a filler.

Now, FIG. 4 is a graph showing results obtained as a result of having examined the adhesion of a filler comprising a crosslinked fluorine-containing polymer resin incorporated with an acid component in relation to the acid value of the filler, wherein a plurality of composites each having obtained by laminating a ETFE (ethylene-tetrafluoroethylene copolymer) film with a surface applied with corona discharging treatment to a filler comprising a crosslinked fluorine-containing polymer resin incorporated with an acid component and having a different acid value were provided, and the adhesion between the two was examined as for each composite laminate.

As FIG. 4 illustrates, it is understood that when the filler is of 2 or more in acid value, the adhesion thereof with the EFTE film is markedly improved. Separately examination was made of the adhesion of the filler with a photovoltaic element. As a result, there were obtained results similar to those shown in FIG. 4.

Figure 5:
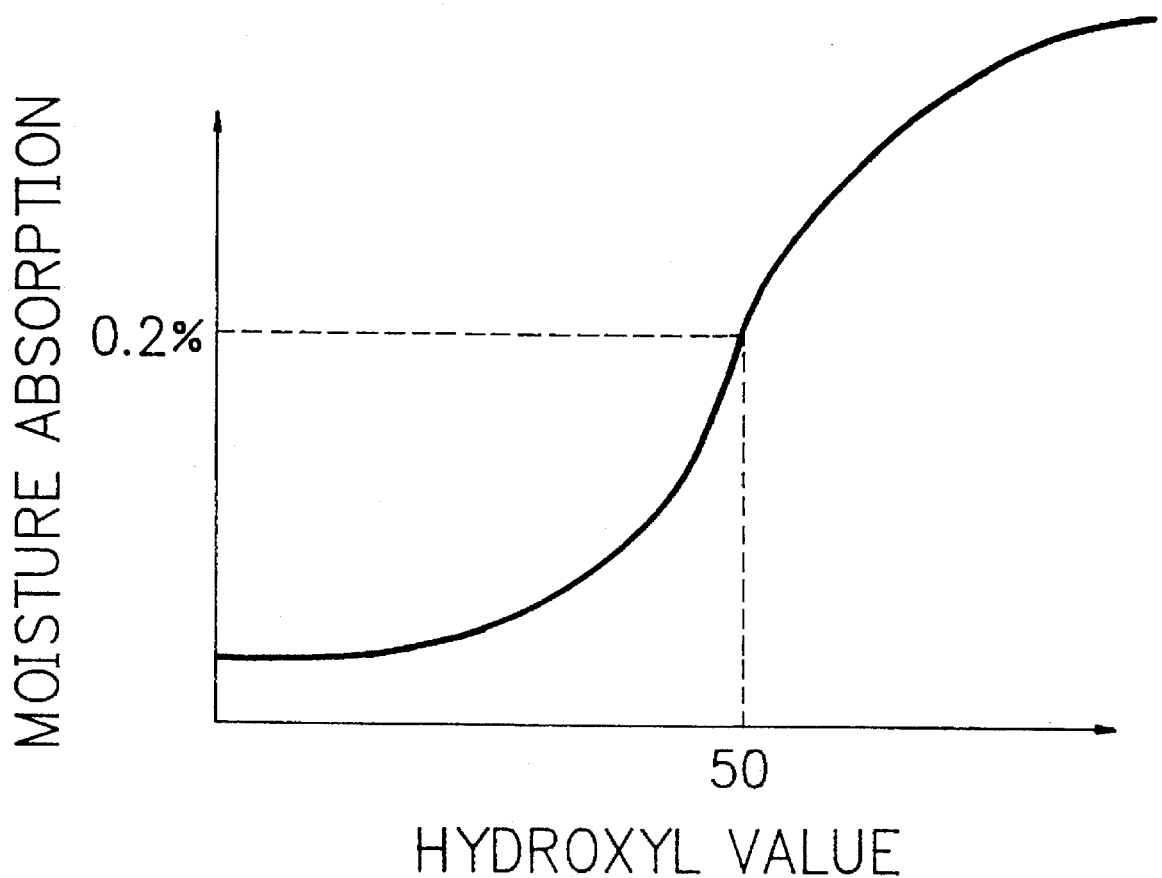
FIG. 5 is a graph showing the interrelation between moisture absortion and hydroxyl value for a filler exposed to an atmosphere of 40° C. and 90% RH for a week.

FIG. 5 is a graph showing the results obtained as a result of having examined the hydroscopicity of a filler comprising a fluorine-containing polymer resin in relation to the hydroxyl value of the filler, wherein a plurality of fillers each comprising a crosslinked fluorine-containing polymer resin obtained from a non-crosslinked fluorine-containing polymer resin having a different hydroxyl value were provided, each filler was exposed to an atmosphere of 40° C./90%RH for a week, and the hydroscopicity of each filler was examined. As FIG. 5 illustrates, it is understood that when the filler is of 50 or more in hydroxyl value, the hydroscopicity of the filler is markedly heightened. The reason for this is considered such that the number of urethane bonds is increased as the hydroxyl value exceeds 50, resulting increasing the hydroscopicity. Separately, there were prepared a plurality of solar cell modules each having a filler comprising one of those crosslinked fluororesins above described, and examination was made of each solar cell module with respect to the situation of occurring a short circuit due to the filler used by exposing the solar cell module to an atmosphere of 40° C./90%RH for a week. As a result, there was obtained a finding that there is a tendency for the solar cell module having a filler comprising a crosslinked fluorine-containing polymer resin obtained from a non-crosslinked fluorine-containing polymer resin having a hydroxyl value of 50 or more to be poor in moisture resistance, wherein the photovoltaic element is liable to suffer from occurrence of a short circuit.

Based on the above findings, it is understood that the fluororesin is desired to be 2 or more in acid value and less than 50 in hydroxyl value.

The acid value means a value of an amount of potassium hydroxide in terms of mg which is required to neutralize acid contained in 1 g of a specimen.

The acid value in the above was obtained by dissolving a fluorine-containing polymer resin specimen in a solvent composed of benzene and ethanol or a solvent composed of ether and ethanol to obtain a solution, subjecting the solution to titration using potassium hydroxide having a predetermined activity and observing the amount of the potassium hydroxide used to neutralize the specimen.

The hydroxyl value means a value of an amount of potassium hydroxide in terms of mg which is required to neutralize acetic acid bonded to an acetylated product obtained from 1 g of a specimen.

The hydroxyl value was obtained in a manner of heating a fluorine-containing polymer resin specimen together with acetic anhydride as an acetylating agent to acetylate the specimen thereby obtaining an acetylated product, measuring a saponification value of the acetylated product, and subjecting the measured result to calculation using the following equation: hydroxyl value=A/(1— 0.00075A)—B, wherein A is a saponification value after the acetylation, and B is a saponification value before the acetylation.

The foregoing copolymer (that is, the fluorine-containing polymer resin) as the filler is desired to be of 50,000 to 300,000 in molecular weight. In the case where the molecular weight is less than 50,000, the resin is brittle. On the other hand, in the case where the molecular weight is beyond 300,000, the resin is poor in productivity.

Now, in the case where a solar cell module is used under severer environmental conditions, it is desired to have a marked adhesion between the filler and the photovoltaic element and also between the filler and the surface protective film.

In order for the filler to attain such adhesion, it is effective to add an appropriate silane coupling agent to the filler.

Specific examples of such silane coupling agent are vinyltrichlorosilane, vinyltris(β-methoxy)silane, vinyltriethoxysilane, vinyltrimethoxysilane, γ-metacryloxypropyltrimethoxysilane, β-(3,4-epoxycyclohexyl)ethyltrimethoxysilane, γ-glycidoxypropylmethyldiethoxysilane, N-β(aminoethyl)γ-aminopropyltrimethoxysilane, N-β(aminoethyl)γ-aminopropylmethyldimethoxysilane, γ-aminopropyltriethoxysilane, N-phenyl-γ-aminopropyltrimethoxysilane, γ-mercaptopropyltrimethoxysilane, and γ-chloropropyltrimethoxysilane.

The filler (that is, the surface side filler) in the present invention essentially excels in weatherability. However, in order to attain a further improved weatherability for the filler and also in order to effectively protect a layer situated under the filler, the filler may contain an appropriate UV absorber. As such UV absorber, there can be used commercially available chemical compounds usable as a UV absorber. Specifically, those chemical compounds can include salicylic acid series compounds, benzophenone series compounds, benzotriazole series compounds, and cyanoacrylate series compounds.

Specific examples of such salicylic acid series compound are phenylsalicylate, p-tert-butylsalicylate, and p-octylphenylsalicylate.

Specific examples of such benzophenone series compound are 2,4-hydroxybenzophenone, 2-hydroxy-4-methoxybenzophenone, 2-hydroxy-4-octoxybenzophenone, 2-hydroxy-4-dodecyloxybenzophenone, 2,2'-hydroxy-4-methoxybenzophenone, 2'2'-dihydroxy-4,4'-dimethoxybenzophenone, 2-hydroxy-4-methoxy-5-sulfobenzophenone, and bis(2-methoxy-4-hydroxy-5-benzophenone)methane.

Specific examples of such benzotriazole series compound are 2-(2'-hydroxy-5'-methylphenyl)benzotriazole, 2-(2'-hydroxy-5'-tert-butylphenyl)benzotriazole, 2-(2'-hydroxy-3', 5'-di-tert-butylphenyl)benzotriazole, 2-(2'-hydroxy-3'-tert-butyl-5-methylphenyl)-5-chlorobenzotriazole, 2-(2'-hydroxy-3',5'-di-tert-butylphenyl)- 5-chlorobenzotriazole, 2-(2'-hydroxy-3',5'-ditert-amylphenyl)benzotriazole, 2-[2'-hydroxy-3''-(3'',4'',5'',6''-tetrahydrophthalimidomethyl)- 5'-methylphenyl]benzotriazole, and 2,2,-methylenebis[4-( 1,1,3,3-tetramethylbutyl)-6-(2H-benzotriazole-2-yl)phenol].

Specific example of such cyanoacrylate series compound are 2-ethylhexyl-2-cyano-3,3'-diphenylacrylate, and ethyl-2-cyano-3,3'-diphenylacrylate.

Further, in order for the filler (that is, the surface side filler) to have an improved weatherability, the filler may contain an appropriate hindered amine series light stabilizer. Although the hindered amine series light stabilizer does not serve to absorb ultraviolet rays as the foregoing UV absorber does, a pronounced advantage is provided by using the hindered amine series light stabilizer in combination with the UV absorber.

There are known other light stabilizers than the hindered amine series light stabilizer, but those light stabilizers are not desirable to use in the filler (that is, the surface side filler) because they are mostly colored and they are therefore liable to impart a negative influence of reducing the photoelectric conversion efficiency of a photovoltaic element particularly in the case of a solar cell module. However, in the case of regarding as important not upon an improvement in the photoelectric conversion efficiency but upon wave components of incident light or an external appearance, such light stabilizers capable of causing coloration in the filler other than the hindered amine series light stabilizer may be selectively used.

Specific examples of the above hindered amine series light stabilizer are succinic acid dimethyl-1-(2-hydroxyethyl)- 4-hydroxy-2,2,6,6-tetramethylpiperidine polycondensation product, poly[{6-(1,1,3,3-tetramethylbutyl)amino- 1,3,5-triazine-2,4-diyl} {(2,2,6,6-tetramethyl-4-piperidyl)imino}hexamethylene{(2,2,6,6-tetramethyl-4-piperidyl)imino}], N,N'-bis(3-aminopropyl)ethylenediamine-2,4-bis[N-butyl-N-( 1,2,2,6,6-pentamethyl-4-piperidyl)amino]-6-chloro-1,3,5-triazine polycondensation product, bis(2,2,6,6-tetramethyl-4-piperidyl)sebalate, and 2-(3,5-d-tert-butyl-4-hydroxybenzyl)-2-n-butylmalonic acid bis(1,2,2,6,6-pentamethyl-4-piperidyl).

The amount of the foregoing UV absorber to be added is desired to be preferably in the range of 0.1 wt. % to 1.0 wt. % versus the amount of the filler resin. The amount of the foregoing light stabilizer to be added is desired to be preferably in the range of 0.005 wt. % to 1.0 wt. % versus the filler resin.

Further, the filler (that is, the surface side filler) may contain an appropriate antioxidant in order to improve its heat resistance. Such antioxidant can include monophenol series antioxidant, bisphenol series antioxidant, high-molecular phenol series antioxidant, sulphur series antioxidant, and phosphorous series antioxidant.

Specific examples of the monophenol series antioxidant are 2,6-di-tert-butyl-p-cresol, butylated hydroxyanisole, and 2,6-di-tert-butyl-4-ethylphenol.

Specific examples of the bisphenol series antioxidant are 2,2'-methylene-bis-(4-methyl-6-tert-butylphenol), 2,2'-methylene-bis-( 4-ethyl-6-tert-butylphenol), 4,4'-thiobis-( 3-methyl-6-tert-butylphenol), 4,4'-butylidene-bis-(3-methyl- 6-tert-butylphenol), and 3,9-[1,1-dimethyl-2-{β-(3-tert-butyl- 4-hydroxy-5-methylphenyl)propionyloxy}ethyl] 2,4,8,10-tetraoxapyrol5,5|undecane.

Specific examples of the high-molecular phenol series antioxidant are 1,1,3-tris-(2-methyl-4-hydroxy-5-tert-butylphenyl)butane, 1,3,5-trimethyl-2,4,6-tris(3,5-di-tert-butyl- 4-hydroxybenzyl)benzene, tetrakis-methylene-3-( 3',5'-di-tert-butyl-4'-hydroxyphenyl)propionate methane, bis{3, 3'-bis-(4'-hydroxy-3'-tert-butylphenyl)butyric}acid glucose ester, 1,3,5-tris(3',5'-di-tert-butyl-4'-hydoxylbenzyl)-s-triazine- 2,4,6-(1H,3H,5H)trione, and tocopherol (Vitamin E).

Specific examples of the sulphur series antioxidant are dilaurylthiodipropionate, dimyristylthiodipropionate, and distearylthiopropionate.

Specific examples of the phosphorous series antioxidant are triphenylphosphate, diphenylisodecylphosphate, phenyldiisodecylphosphate, 4,4'-butylidene-bis-( 3-methyl-6-tert-butylphenyl-di-tridecyl)phosphate, cyclicneopentanetetrabis(octadecylphosphate), tris(mono or di)phenylphosphate, diisodecylpentaerythritoldiphosphate, 9,10-dihydro-9-oxa-10-phosphenanthrene-10-oxide, 10-(3,5-di-tert-butyl- 4-hydroxybenzyl)-9,10-dihydro-9-oxa-10-phosphenanthrene-10-oxide, 10-decyloxy-9,10-dihydro-9-oxa- 10-phosphenanthrene, cyclicneopentanetetrabis(2,4-di-tert-butylphenyl)phosphate, cyclicneopentanetetrabis(2,6-di-tert-methylphenyl)phosphate, and 2,2-methylenebis(4,6-tert-butylphenyl)octylphosphate.

The amount of the antioxidant to be added is desired to be in the range of 0.05 wt. % to 1.0 wt. % versus the amount of the filler resin.

With consideration of use environmental conditions for a solar cell module in which the foregoing surface side filler is disposed, any of the above described UV absorber, light stabilizer and antioxidant is desired to be low in volatility.

Now, in order to prevent a decrease in the quantity of incident light to be arriving in the photovoltaic element, the surface side filler is desired to be substantially transparent. Specifically, it is desired for the surface side filler to have a transmittance of preferably 80% or more or more preferably 90% or more in a visible light wavelength region of 400 nm to 800 nm. Further, in order to facilitate external light to be readily impinged into the photovoltaic element, the surface side filler is made to be such that it has a refractive index of preferably 1.1 to 2.0 or more preferably 1.1 to 1.6 at a temperature of 25° C.

Description will be made of the surface protective film. In the case of a solar cell module of the constitution shown in FIG. 2, because its surface protective film is situated at the outermost surface of the solar cell module, it is required to be excellent in weatherability, pollution resistance and physical strength. In addition, in the case where the solar cell module is used under severe environmental conditions in outdoors, the surface protective film is required to be such that it ensures the solar cell module to be sufficient enough in durability upon repeated use over a long period of time. In view of this, the surface protective film is desired to be composed of fluororesin or acrylic resin. Of these resins, the fluororesin is the most appropriate because it excels in weatherability and pollution resistance. In the most preferred embodiment, the fluororesin comprises a fluorine-containing polymer resin with a fluorine content of 40 wt. % to 60 wt. %. This fluorine-containing polymer resin desirably satisfies the above requirements for the surface protective film. Specific examples of such fluorine-containing polymer resin are polyvinylidene fluoride resin and ethylene tetrafluoride-ethylene copolymer.

Polyvinylidene fluoride excels in terms of weatherability. Ethylene tetrafluoride-ethylene copolymer excels not only in terms of weatherability but also in terms of physical strength.

In order to attain an improved adhesion for the surface protective film with the surface side filler, the surface protective film is desired to be subjected to surface treatment upon its lamination to the surface side filler. The surface treatment in this case can include corona discharging treatment, plasma treatment, ozone treatment, UV-ray irradiation treatment, electron beam irradiation treatment, and flame treatment. Of these surface treatments, the corona discharging treatment is the most appropriate.

Figure 6A:
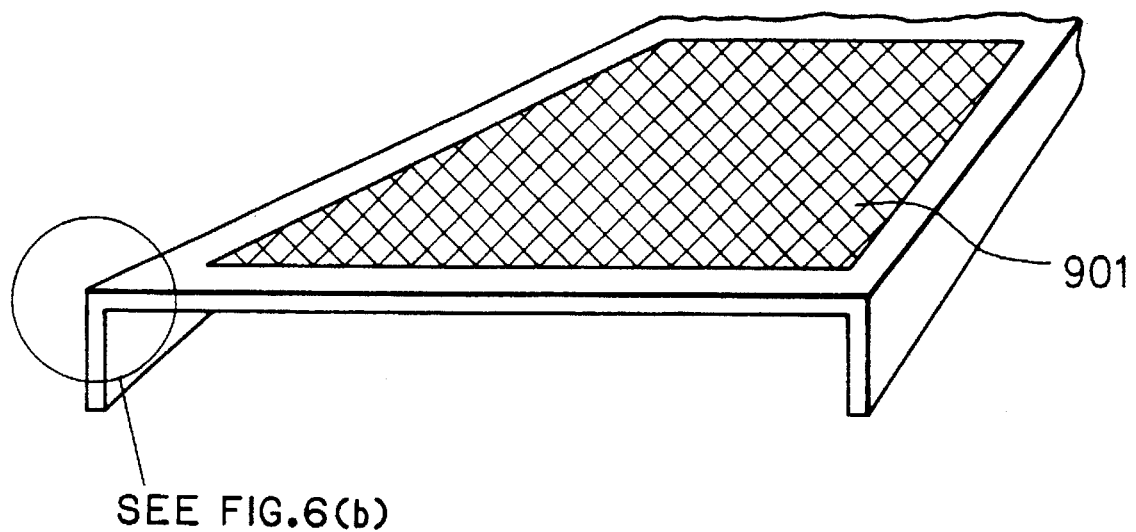
Figure 6B:
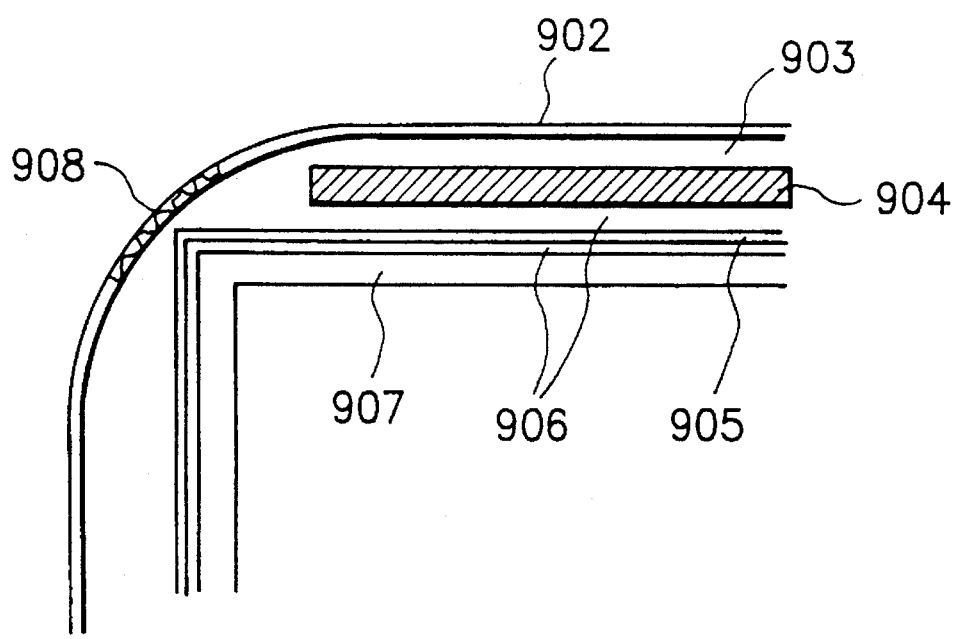
Figure 7A:
FIGS. 7(a) through 7(d) are schematic views for explaining formation steps upon obtaining a solar cell module in the present invention.
Figure 7B:
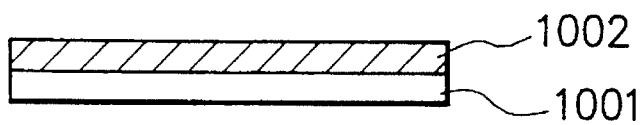
Figure 7C:
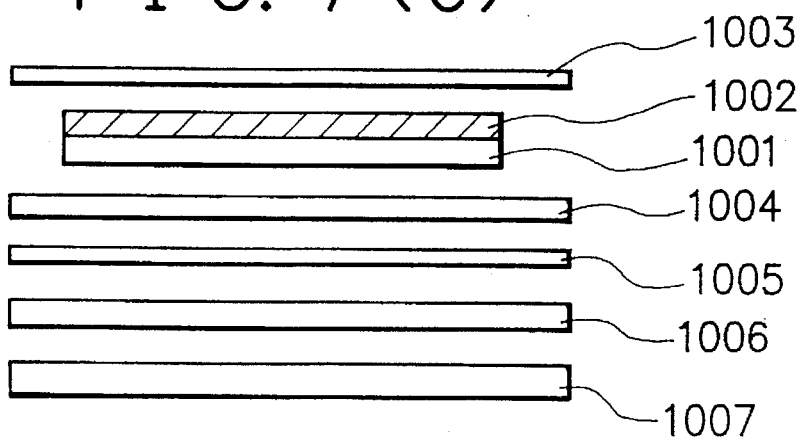
Figure 7D:
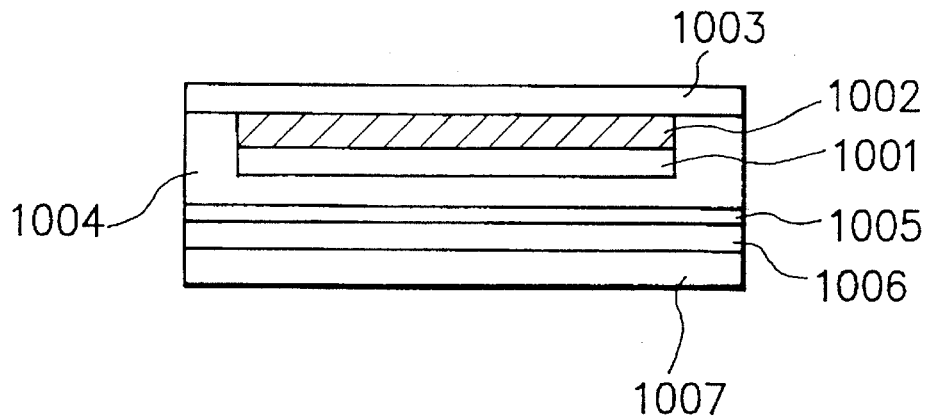

In the case where the solar cell module is of the type that is placed in outdoors, for instance, at a roof of a building, there is a manner of fixing the solar cell module wherein the solar cell module is processed to have bent fixing portions. FIGS. 6(a) and 6(b) are schematic explanatory views illustrating such solar cell module having bent fixing portions. FIG. 6(b) is an enlarged and exploded view of the area designated 908 in FIG. 6(a). In FIGS. 6(a) and 6(b), reference numeral 901 indicates the entire of a solar cell module, reference numeral 902 a surface protective film, reference numeral 903 a surface side filler, reference numeral 904 a photovoltaic element as a photoelectric conversion element (or a solar cell), reference numeral 905 a back face protective film, reference numeral 906 a back face side filler, reference numeral 907 a back face reinforcing member, and reference numeral 908 a bent portion.

As apparent from FIGS. 6(a) and 6(b), the solar cell module 901 has opposite bent portions each being formed by bending the photovoltaic element-free corresponding portion of the solar cell module.

Incidentally, it is known that an tetrafluoroethylene-ethylene copolymer film which is stretched has such characteristics that its drawn direction is lower in terms of breaking extension and higher in terms of breaking tenacity in comparison with the non-drawn direction or that the film itself is lower in terms of breaking extension and higher in terms of breaking tenacity in comparison with a non-drawn film composed of ethylene tetrafluoride-ethylene copolymer.

However, when said stretched ethylene tetrafluoride-ethylene copolymer film is used as the surface protective film of a solar cell module, the film does not always attain an improvement in the reliability of the solar cell module. Particularly, when the tetrafluoroethylene-ethylene copolymer film is stretched, the resultant film is liable to be torn in the drawn direction. Because of this, the use of this stretched tetrafluoroethylene-ethylene copolymer film as the surface protective film conversely provides a disadvantage of reducing the reliability of the solar cell module. Specifically, when the stretched tetrafluoroethylene-ethylene copolymer film is used as the surface protective film and it is bent, a problem occurs in that a breakage or crack is often occurred at the bent portion 908 (see, FIG. 6(b)). In order to avoid occurrence of such problem, it is necessary to bend the protective surface film at a relatively large curvature or while heating the film.

Now, in the case of using a non-drawn film as the surface protective film, it is not necessary to bend it at a relatively large curvature or while being heated upon forming a bent fixing portion at a solar cell module, as long as the film has such a physical strength that the film can serve as the surface protective film in the solar cell module.

In the following, description will be made of a manner of producing a photoelectric conversion module (specifically, a solar cell module) according to the present invention using the foregoing photovoltaic element (or photoelectric conversion element), surface side filler resin, surface protective film, and back face protective materials.

To coat a light receiving face of the photovoltaic element by the surface side filler may be conducted by (a) a manner of applying a coating liquid comprising a filler material dissolved in a solvent onto the surface of a photovoltaic element and vaporizing the solvent of the coating liquid applied, (b) a manner of uniformly depositing a powdery filler material on the surface of a photovoltaic element and subjecting the powdery filler material deposited to heat fusion, (c) a manner of providing a heat-fused product of a filler material and applying the heat-fused product onto the surface of a photovoltaic element through a slit, or (d) a manner of obtaining a sheet of a filler material using a heat-fused product of the filler material and laminating the sheet on the surface of a photovoltaic element by way of thermocompression bonding.

In the case of the above manner (a), if necessary, one or more of the foregoing organic peroxide, silane coupling agent, UV absorber, and antioxidant are firstly mixed with the solvent prior to dissolving the filler material therein. In this case, when the organic peroxide is used, the step of vaporizing the coating liquid applied is necessary to be conducted at a temperature at which the organic peroxide is not decomposed. Similarly, in any of the remaining manners (b) to (d), in the case of using one or more of the foregoing organic peroxide, silane coupling agent, UV absorber, and antioxidant, such additive is added to the filler material prior to heat-fusing the filler material, wherein when the organic peroxide is used, the heat fusion is necessary to be conducted at a temperature at which the organic peroxide is not decomposed.

FIGS. 7(a) through 7(d) are schematic views for explaining a manner of producing a solar cell module wherein a filler material is first applied on the surface of a photovoltaic element (or a photoelectric conversion element) and steps necessary to obtain the solar cell module are successively conducted. FIGS. 8(a) through 8(d) are schematic views for explaining another manner of producing a solar cell module wherein a sheet composed of a filler material is first provided and steps necessary to obtain the solar cell module are successively conducted.

In the case of the manner shown in FIGS. 7(a) through 7(d) wherein a surface side filler 1002 is firstly formed on the surface of a photovoltaic element 1001, there is obtain a composite comprising a back face side filler material 1004, a back face protective film 1005, a back face side filler material 1006 and a back face reinforcing member 1007 being laminated in this order on the rear face of the photovoltaic element and a surface protective film 1003 being laminated on the surface of the surface side filler formed on the surface of the photovoltaic element, and the resultant composite is subjected to thermocompression bonding, whereby a desirable solar cell module can be obtained. In this manner, it is possible for the back face reinforcing member 1007 to be laminated to the back face protective film 1005 by means of other appropriate adhesive than the back face side filler 1006. The lamination in this case may be conducted upon conducting the above thermocompression bonding or it may be independently conducted by an appropriate lamination means.

Figure 8A:
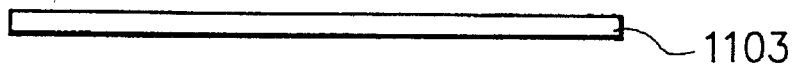
FIGS. 8(a) through 8(d) are schematic views for explaining formation steps upon obtaining a solar cell module in the present invention.
Figure 8B:
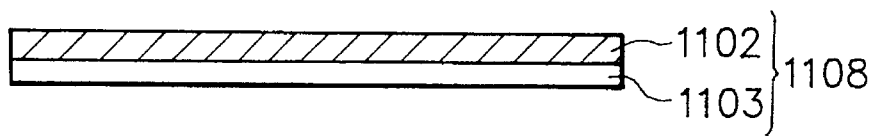
Figure 8C:
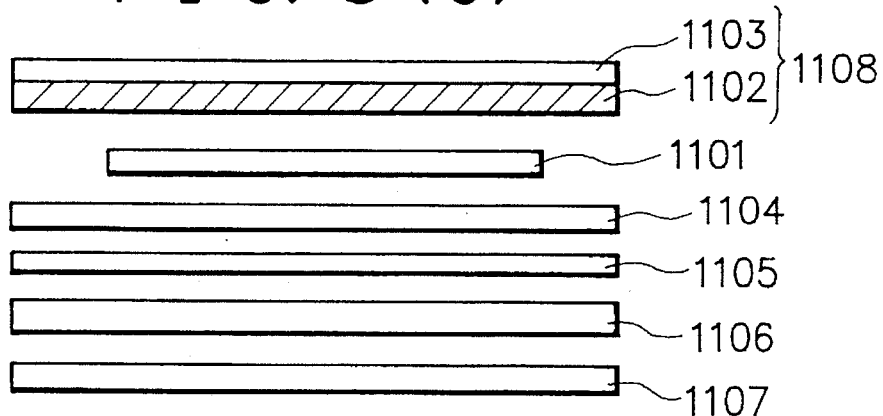
Figure 8D:
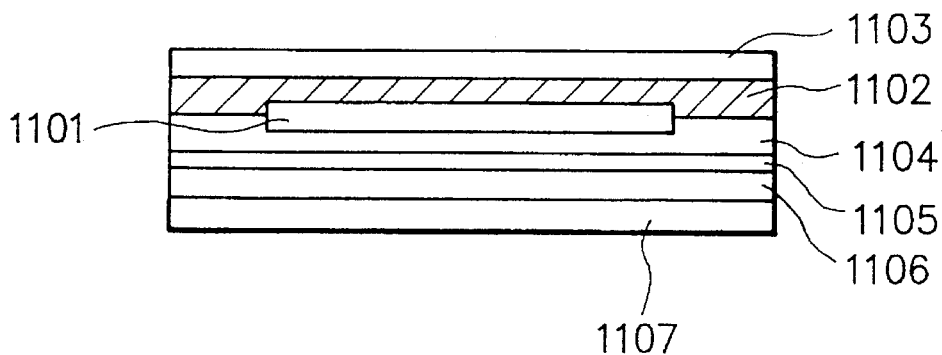
Figure 9A:
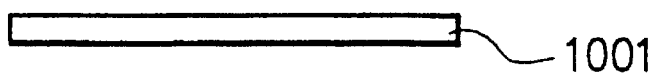
FIGS. 9(a) through 9(d) are schematic views for explaining formation steps upon obtaining a solar cell module in the present invention.
Figure 9B:
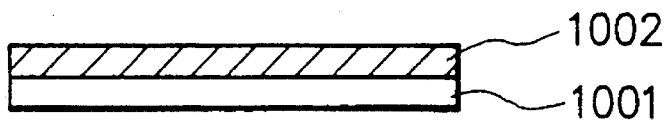
Figure 9C:
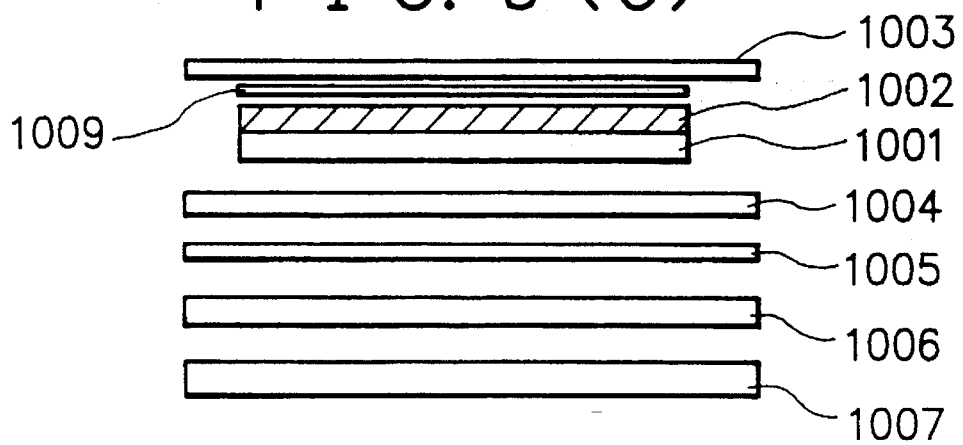
Figure 9D:
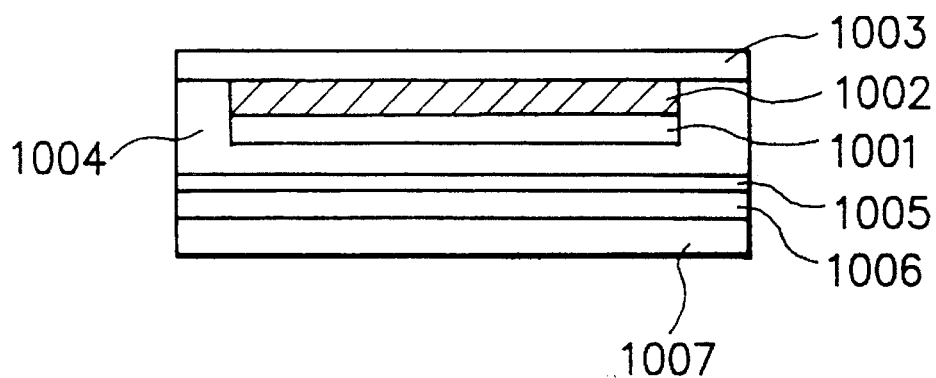

In the case of the manner shown in FIGS. 8(a) through 8(b) wherein a sheet-like surface side filler 1102 is used, the procedures thereof are the same as those in the manner shown in FIGS. 7(a) through 7(d) except for inserting the sheet between the photovoltaic element 1101 and the surface protective film 1103, wherein a desirable solar cell module can be obtained.

In any case, in the case where the filler contains the foregoing organic peroxide, the thermocompression bonding is necessary to be conducted at a temperature at which the organic peroxide is sufficiently decomposed.

The thermocompression bonding can include vacuum lamination and roll lamination.

As for the thickness of the surface side filler after the thermocompression bonding has been conducted, it is desired to be preferably in the range of 50 μm to 1000 μm, more preferably in the range of 100 μm to 500 μm. Although it depends upon the constitution of a photovoltaic element used, when the thickness is less than 50 μm, it is difficult to sufficiently coat irregularities present at the surface of the photovoltaic element or it is difficult to attain a desirable filler coat with no pause on the surface of the photovoltaic element. In addition, in this case, the effect of the surface side filler of relaxing a stress between the photovoltaic element and the surface protective film which is caused due to a difference between their thermal expansion coefficients is liable to become insufficient, wherein there is a fear of causing a removal at the surface protective film or the surface side filler. On the other hand, when the thickness exceeds 1000 μm, a defect such as crack is liable to occur at the surface side filler layer upon the bending operation. In addition, since the surface side filler is comprised of the foregoing fluororesin which is costly, an increase in its amount to be used makes the resulting product costly.

Taking these factors into consideration, the thickness of the surface side filler should be properly determined while having a due care about the properties possessed by a fluorine-containing polymer resin used as the surface side filler and cost performances desired for the surface side filler.

Separately, it is possible for the filler to contain an appropriate reinforcing material such as glass fiber. The use of such reinforcing material is effective in improving the physical strength of the filler and in further preventing the photovoltaic element from being damaged. The incorporation of such reinforcing material, for instance glass fiber, into the filler may be conducted by a manner of mixing a filler resin used as the filler with glass fiber in advance or another manner of laminating a nonwoven glass fiber sheet to a filler sheet and subjecting the resultant to the foregoing thermocompression bonding or appropriate processing.

FIGS. 9(a) through 9(d) are schematic view for explaining a manner of producing a solar cell module wherein the above reinforcing material 1009 comprising a glass fiber is used. The procedures this manner are the same as those in the manner shown in FIGS. 7(a) through 7(d) except for inserting a nonwoven glass fiber sheet 1009 between the surface protective film 1003 and the surface side filler 1002, wherein a desirable solar cell module can be obtained. It should be noted that the reinforcing material used in this case is not limited to glass fiber only, but other appropriate materials capable of functioning as the glass fiber does may be selectively used.

In the following, the present invention will be described in more detail with reference to examples which are not intended to restrict the scope of the present invention.

EXAMPLE 1

1. Preparation of Photoelectric Conversion Element (Solar Cell)

There were prepared a plurality of solar cells each having the configuration shown in FIGS. 3(a) and 3(b) and which has a semiconductor active layer composed of an amorphous silicon material (that is, a—Si material) (this solar cell will be hereinafter referred to as a—Si solar cell) in the following manner.

That is, there was firstly provided a well-cleaned stainless steel plate as the substrate 201. On the substrate, there was formed a two-layered back reflecting layer 202 comprising a 5000 Å thick Al film/a 5000 Å thick ZnO film by means of the conventional sputtering manner, followed by forming, on the back reflecting layer 202, a tandem type a—Si photoelectric conversion semiconductor layer comprising a 150 Å thick n-type layer/a 4000 Å thick i-type layer/a 100 Å thick p-type layer/a 100 Å thick n-type layer/a 800 Å thick i-type layer/a 100 Å thick p-type layer being laminated in this order from the substrate side as the semiconductor active layer 203 by means of the conventional plasma CVD manner. Then, on the semiconductor active layer 203, there was formed a 700 Å thick transparent and conductive layer 204 composed of $In_2O_3$ by means of the conventional heat resistance evaporation manner wherein an In source was evaporated in an $O_2$ atmosphere. Successively, an Ag-paste comprising powdery Ag dispersed in polyester resin (trademark name: Ag-paste No. 5007, produced by Du pont Company) was screen-printed on the transparent and conductive layer 204, followed by drying, to thereby form a grid electrode as the collecting electrode 205. As for the resultant, a copper tub as the negative side power outputting terminal 206b was fixed to the substrate 201 using a stainless solder 208, and a tin foil tape as the positive side power outputting terminal 206a was fixed to the collecting electrode 205 using an electroconductive adhesive 207. Thus, there was obtained an a—Si solar cell. In this way, there were obtained a plurality of a—Si solar cells.

2. Preparation of Module

Using each of the a—Si solar cells obtained in the above 1, there were prepared a plurality of solar cell modules each having the configuration shown in FIG. 10 in the following manner.

Figure 10:
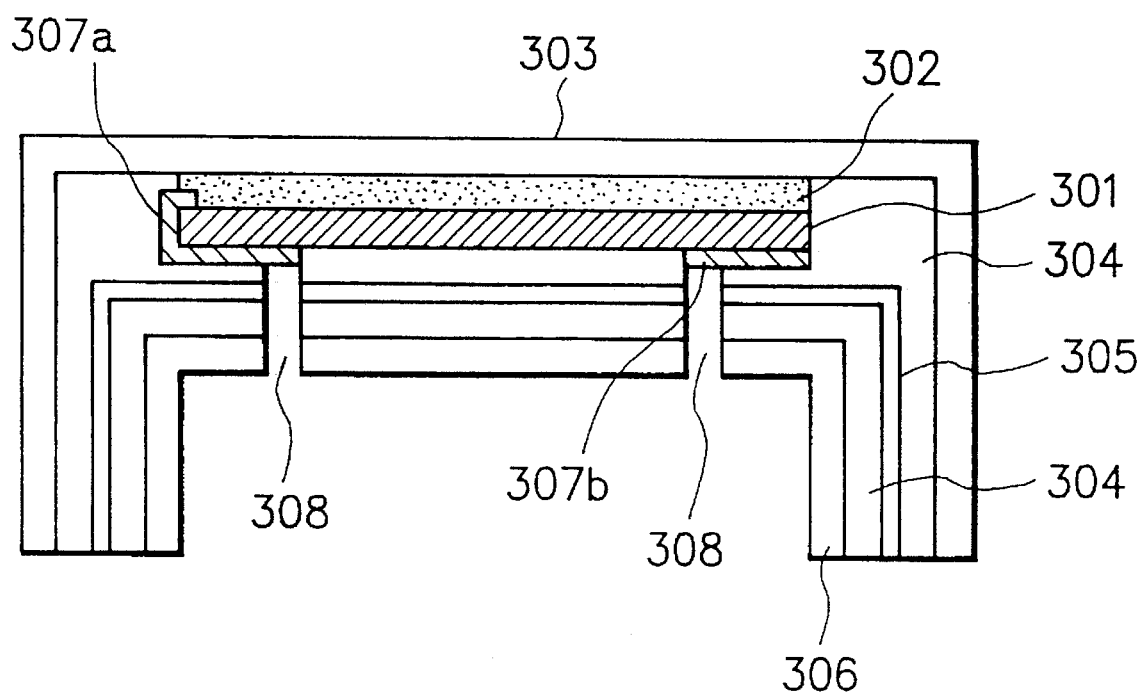
FIG. 10 is a schematic cross-sectional view illustrating the constitution of a solar cell module in which the present invention can be applied.

In FIG. 10, reference numeral 301 indicates a photoelectric conversion element (corresponding to the foregoing a—Si solar cell in this case), reference numeral 302 a surfaceside filler, reference numeral 303 a surface protective film, reference numeral 304 a back face filler, reference numeral 305 a back face protective film, reference numeral 306 a back face reinforcing member, reference numeral 307a a positive side power outputting terminal (corresponding to the foregoing power outputting terminal 206a), reference numeral 307b a negative side power outputting terminal (corresponding to the foregoing power outputting terminal 206b), and reference numeral 308 a pair of wiring holes each for one of the power outputting terminals 307a and 307b. Each power outputting hole is penetrated through the back face constituents from the back face reinforcing member 306 such that it reaches the corresponding power outputting terminal. The solar cell module shown in FIG. 10 has opposite bent portions each having formed by a solar cell-free side end portion thereof for the purposes of facilitating the strength of the solar cell module and enabling to easily place the solar cell module at a roof of a building.

Formation of Surface Side Filler

There was firstly prepared a filler material usable as the surface side filler in the following manner.

There was provided chlorotrifluoroetylene-vinyl ether copolymer resin having the following general structural formula (III) (trademark name: LUMIFLON LF400 (fluorine content: 30 wt. %, acid value: 2 mg KOH/g, hydroxyl value: 48 mg KOH/g), produced by Asahi Glass Co., Ltd.).

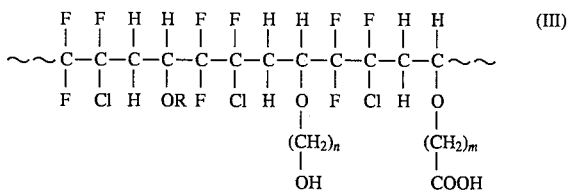

(wherein R is an alkyl group)

100 parts by weight of the above copolymer resin, 3 parts by weight of dicuminyl peroxide as a crosslinking agent, 2 parts by weight of triallylcyanurate as a crosslinking assistant, 0.3 part by weight of γ-methacryloxypropyltrimethoxysilane as a coupling agent (trademark name: SZ6030, produced by Toray Dow Corning Silicone Company), 0.3 part by weight of 2-hydroxy-4-n-octoxybenzophenone as a UV absorber (trademark name: CYASORB UV-531, produced by American Cyanamid Company), and 0.2 part by weight of tris(mono-nonylphenyl)phosphate as an antioxidant (trademark name: NOUGARD P, produced by Uniroyal Chemical Company, Inc.) were introduced into xylene while stirring, whereby a xylene solution with a resin content of 50 wt. % was obtained.

The resultant xylene solution was applied onto the light receiving face of the solar cell 301 in an amount to provide a thickness of about 200 μm when dried, followed by repetition of a drying process at 60° C. for 30 minutes, whereby an about 200 μm thick filler layer 302 was formed on the light receiving face of the solar cell.

Preparation of Solar Cell Module

There was provided a 50 μm thick nondrawn ETFE film (trademark name: AFLEX, produced by Asahi Glass Co., Ltd.). The ETFE film was subjected to corona discharging treatment whereby one of the opposite faces thereof was treated by the corona discharging, followed by superposing the ETFE film as the surface protective film 303 through its corona-discharged face to the surface of the filler layer 302. On the rear face of the resultant, there were laminated a 460 μm thick EVA film 304 (produced by Mobay Company), a 63.5 μm thick nylon film 305 (trademark name: DARTEK, produced by Du Pont Company), and a galvalume steel member (or a Zn-coated steel member) 306 in this order. The stacked body thus obtained was placed in a vacuum vessel, wherein it was subjected to heat treatment at 160° C. for 30 minutes while evacuating the inside of the vacuum vessel to a predetermined vacuum degree, followed by cooling to room temperature.

In the above, the power outputting terminal 307a was extended to the rear side of the solar cell so that not only the power outputting terminal 307b but also the power outputting terminal 307a could be wired to the outside through the wiring holes 308.

Thus, there was obtained a solar cell module. The solar cell-free opposite side portions of the solar cell module thus obtained were bent at a curvature of 90° for the purposes of improving the strength of the solar cell module and making the solar cell module to be easily placed at a roof of a building.

In this way, there were obtained a plurality of solar cell modules each having opposite bent portions.

Evaluation

Using the resultant solar cell modules, evaluation was conducted with respect to (1) initial photoelectric conversion efficiency, (2) weatherability, (3) heat resistance, (4) endurance against changes in environmental temperature, (5) endurance against changes in environmental temperature and humidity, (6) moisture resistance, and (7) resistance to scratching.

The evaluated results obtained are collectively shown in Table 1.

As for the fluorine content of the filler layer 302, it was obtained by a manner of subjecting a specimen of the filler layer to emission X-rays analysis wherein the specimen was irradiated with electron beam, and calculating an actual fluorine content based on the resultant X-ray intensity corresponding to fluorine. Further, a specimen of the filler layer was subjected to extraction using xylene, wherein a nongel component thereof was extracted, wherein a gel component was remained as a residue. And the gel content thereof was calculated based the residual gel component obtained. These results are also collectively shown in Table 1.

The evaluation of each of the above evaluation items (1) to (7) was conducted in the following manner.

(1) Evaluation of the Initial Photoelectric Conversion Efficiency

The solar cell module was subjected to measurement with respect to its initial photoelectric conversion efficiency by means of a solar simulator (trademark name: SPI-SUN SIMULATOR 240A (AM 1.5), produced by SPIRE Company). The resultant value shown in Table 1 is a value relative to the initial photoelectric conversion efficiency obtained in Comparative Example 1 which will be later described, which was set at 1.

(2) Evaluation of the Weatherability

The solar cell module was placed in a carbon-arc sunshine weather meter, wherein it was irradiated with pseudo sunlight for 5000 hours under conditions of alternately repeating a cycle of maintaining at a black panel temperature of 63° C. for 108 minutes and a cycle of pure water fall for 12 minutes. Thereafter, its exterior appearance was observed. The observed result shown by a mark ○ in Table 1 indicates the case where no change was observed for the exterior appearance. As for the case with a change in the exterior appearance, comments are described in Table 1.

(3) Evaluation of the Heat Resistance

The solar cell module was exposed to an atmosphere of 150° C. for 24 hours, and thereafter, its exterior appearance was observed. The observed result shown by a mark ○ in Table 1 indicates the case where no change was observed for the exterior appearance. As for the case with a change in the exterior appearance, comments are described in Table 1.

After the test, the solar cell module was evaluated with respect to its photoelectric conversion efficiency. The evaluated result shown in Table 1 is a relative reduction proportion value to its initial photoelectric conversion efficiency.

(4) Evaluation of the Endurance Against Changes in Environmental Temperature

The solar cell module was subjected to alternate repetition of a cycle of exposing to an atmosphere of −40° C. for an hour and a cycle of exposing to an atmosphere of 90° C. for an hour 50 times, and thereafter, its exterior appearance was observed. The observed result shown by a mark ○ in Table 1 indicates the case where no change was observed for the exterior appearance. As for the case with a change in the exterior appearance, comments are described in Table 1.

(5) Evaluation of the Endurance Against Changes in Environmental Temperature and Humidity The solar cell module was subjected to alternate repetition of a cycle of exposing to an atmosphere of −40° C. for an hour and a cycle of exposing to an atmosphere of 80° C./85%RH for 4 hours 50 times, and thereafter, its exterior appearance was observed. The observed result shown by a mark ○ in Table 1 indicates the case where no change was observed for the exterior appearance. As for the case with a change in the exterior appearance, comments are described in Table 1.

(6) Evaluation of the Moisture Resistance

The solar cell module was placed in a solar simulator (trademark name: YSS-150, produced by Ushio Inc.), wherein it was exposed to an atmosphere of 85° C./85%RH for 24 hours while irradiating pseudo sunlight thereto, and thereafter, its photoelectric conversion efficiency was evaluated.

The evaluated result shown in Table 1 is a relative reduction proportion value to its initial photoelectric conversion efficiency.

(7) Evaluation of the Resistance to Scratching

Figure 11:
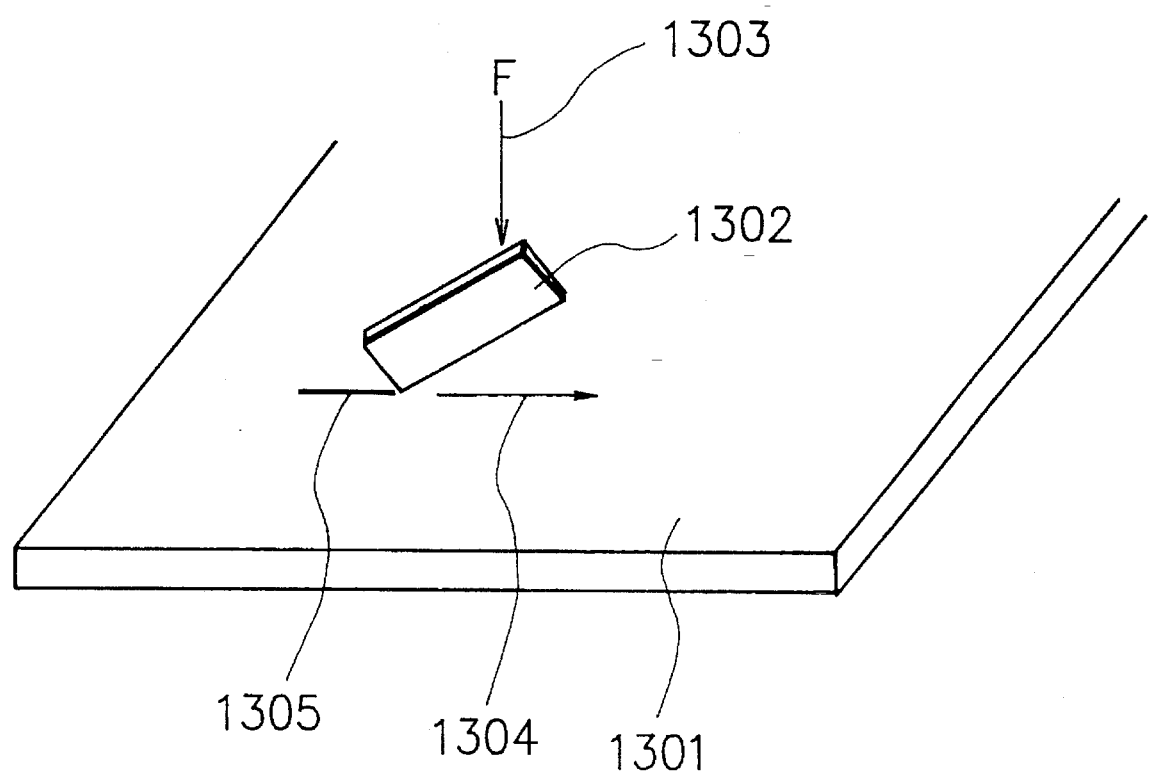
FIG. 11 is a schematic view for explaining the scratch resistance test which will be later described.

This evaluation was conducted in the following manner. That is, the solar cell module was subjected to surface treatment in a manner shown in FIG. 11, wherein a 1 mm thick carbon steel plate 1302 was contacted through a corner thereof to a irregularities-bearing portion of the surface 1301 of the solar cell module, and the carbon steel plate was then pulled in a direction indicated by an arrow 1304 while applying a load (F) 1303 of 2 pounds to the carbon steel plate to form a scratch 1305. Then the solar cell module thus treated was evaluated of whether or not its scratched portion of the surface coat is still insulative in isolating the photovoltaic element from the outside. This evaluation was conducted by immersing the treated solar cell module in an electrolytic solution of 3000 Ω.cm, and applying a voltage of 2200 V between the photovoltaic element of the solar cell module and the electrolytic solution to observe a leakage current occurred. The evaluated result is shown in Table 1 based on the following criteria.

○: the case where the leakage current is 50 μA or less, and

X: the case where the leakage current beyond 50 μA.

EXAMPLE 2

Figure 12A:
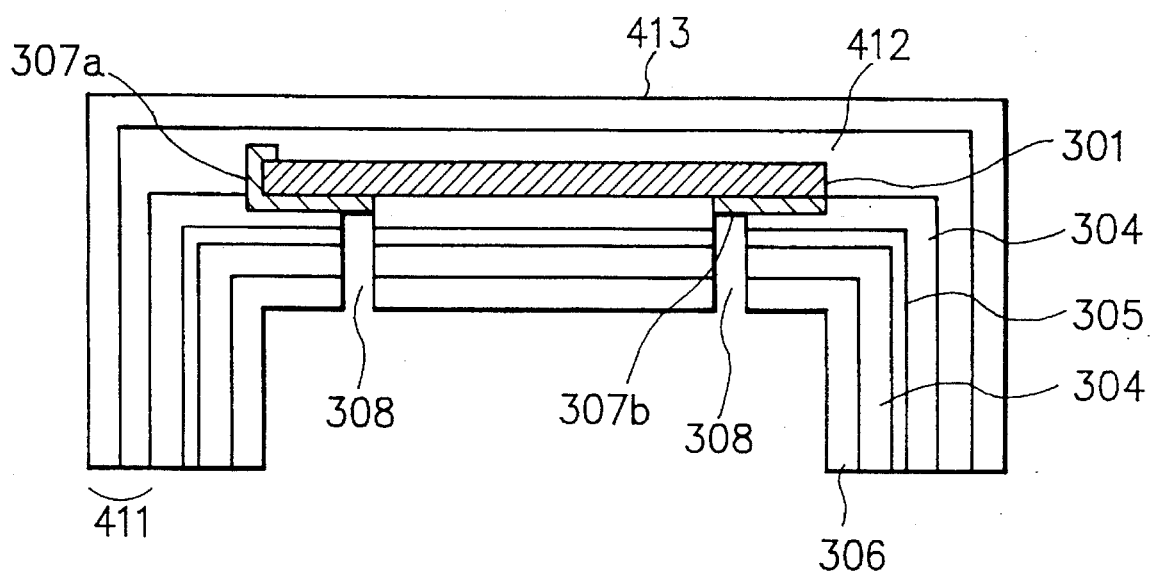
FIG. 12(a) is a schematic cross-sectional view illustrating the constitution of another solar cell module in which the present invention can be applied.
Figure 12B:
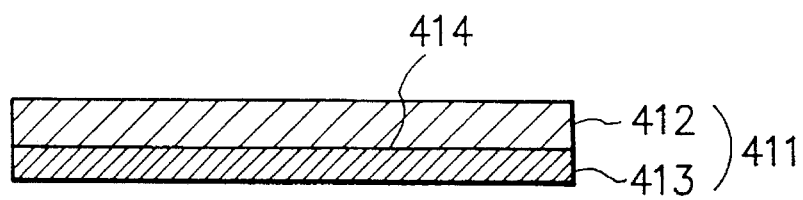
FIG. 12(b) is a schematic cross-sectional view illustrating an example of a stacked structure having a fluororesin (ETFE) film in the present invention.

There were prepared a plurality of solar cell modules each having the configuration shown in FIGS. 12(a) and 12(b).

The configuration shown in FIGS. 12(a) and 12(b) is a partial modification of the configuration shown in FIG. 10, wherein a surface side filler indicated by reference numeral 412 is extended to opposite sides while covering the surface of the photoelectric conversion element (the solar cell) 301 and on the surface of the surface side filler, a surface protective film 413 is laminated. Reference numeral 411 indicates a composite laminate comprising the surface protective film 413 laminated on the surface side filler 412. FIG. 12(b) is a schematic cross-sectional view for explaining the situation in that the surface protective film 413 has a surface 414 applied with corona discharging treatment and the surface protective film 413 is laminated on the surface of the surface side filler 412 through said corona-discharged surface 414.

1. Preparation of Photoelectric Conversion Element (Solar Cell)

There were prepared a plurality of a—Si solar cells in the same manner as in Example 1.

2. Preparation of Module

Using each of the a—Si solar cells obtained in the above, there were prepared a plurality of solar cell modules each having the configuration shown in FIGS. 12(a) and 12(b) in the following manner.

Formation of Surface Side Filler

The formation of a surface side filler 412 on the a—Si solar cell was conducted by using a composite laminate obtained by providing a nondrawn ETFE film of 50 um in thickness (trademark name: AFLEX, produced by Asahi Glass Co., Ltd.) having a surface 414 applied with corona discharging treatment and applying, on the corona-discharged surface of the ETFE film, a fused product of chlorotrifluoroethylene-vinyl ether copolymer resin having the foregoing general structural formula (III) (trademark name: LUMIFLON LF400 (fluorine content: 30 wt. %, acid value: 2 mg KOH/g, hydroxyl value: 48 mg KOH/g), produced by Asahi Glass Co., Ltd.) which is the same as the fluororesin used in Example 1.

Particularly, 100 parts by weight of aforesaid copolymer resin, 3 parts by weight of 2,5-dimethyl-2,5-bis(t-butylperoxy)hexane (trademark name: LUPERSOL 101, produced by Atochem Yoshitomi, Ltd.) as a crosslinking agent, 2 parts by weight of triallyloyanurate as a crosslinking assistant, 0.3 part by weight of -methacryloxypropyltrimethoxysilane as a coupling agent (trademark name: SZ6030, produced by Toray Dow Corning Silicone Company), 0.3 part by weight of 2-(2-hydroxy-5-t-octoxyphenyl)benzotriazole as a UV absorber (trademark name: CYASORB UV-5441, produced by American Cyanamid Company), and 0.1 part by weight of bis(2,2,6,6-tetramethyl- 4-piperidyl)sebacate as a light stabilizer (trademark name: TINUVIN 770, produced by Ciba-Geigy Company), and 0.2 part by weight of tris-(mononylphenyl)phosphate as an antioxidant (trademark name: NAUGARD P, produced by Uniroyal Chemical Company, Inc.) were mixed, followed by subjecting heat fusion at 100° C. to obtain a fused product. The fused product thus obtained was applied onto the corona-discharged surface of the above described ETFE film using a die coater, whereby a composite laminate 411 comprising a filler layer 412/a surface protective ETFE film 413.

Preparation of Solar Cell Module

The procedures of preparing the solar cell module in Example 1 were repeated, except that the composite laminate 411 obtained in the above was superposed through the filler layer side on the light receiving face of the foregoing solar cell, to thereby obtain a solar cell module.

In this way, there were obtained a plurality of solar cell modules each having opposite bent portions.

Using the resultant solar cell modules, evaluation was conducted in the same evaluation manner as in Example 1.

The evaluated results obtained are collectively shown in Table 1.

EXAMPLE 3

There were prepared a plurality of solar cell modules by repeating the procedures of Example 1, except for replacing the fluororesin used as the surface side filler in Example 1 by chlorotrifluoroethylene-vinyl ester copolymer resin having the following general structural formula (IV) (trademark name: ZAFLON FC-110 (fluorine content: 25 wt. %, acid value: 3 mg KOH/g, hydroxyl value: 44 mg KOH/g), produced by Toagosei Chemical Industry Co., Ltd.).

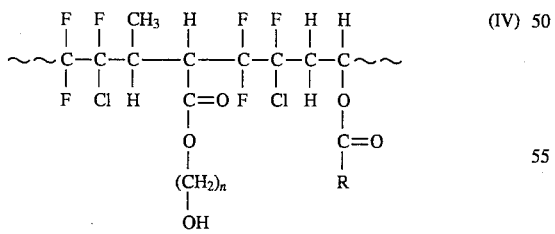

(wherein R is an alkyl group)

Using the resultant solar cell modules, evaluation was conducted in the same evaluation manner as in Example 1.

The evaluated results obtained are collectively shown in Table 1.

EXAMPLE 4

There were prepared a plurality of solar cell modules by repeating the procedures of Example 1, except for replacing the fluororesin used as the surface side filler in Example 1 by chlorotrifluoroethylene-vinyl copolymer resin having the following general structural formula (V) (trademark name: CEFRALCOAT A-100 (fluorine content: 25 wt. %, acid value: 0 mg KOH/g, hydroxyl value: 58 mg KOH/g), produced by Central Glass Co., Ltd.).

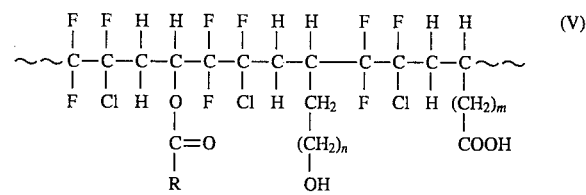

(wherein R is an alkyl radical)

Using the resultant solar cell modules, evaluation was conducted in the same evaluation manner as in Example 1.

The evaluated results obtained are collectively shown in Table 1.

EXAMPLE 5

There were prepared a plurality of solar cell modules by repeating the procedures of Example 1, except for replacing the fluororesin used as the surface side filler in Example 1 by clorotrifluoroethylene-vinylester copolymer resin (trademark name: ZAFLON FC-220 (fluorine content: 25 wt. %, acid value: 3 mg KOH/g, hydroxyl value: 53 mg KOH/g), produced by Toagosei Chemical Industry Co., Ltd.).

Using the resultant solar cell modules, evaluation was conducted in the same evaluation manner as in Example 1.

The evaluated results obtained are collectively shown in Table 1.

EXAMPLE 6

The procedures of Example 2 were repeated, except that no silane coupling agent was used upon forming the surface side filler, to thereby obtain a plurality of solar cell modules.

Using the resultant solar cell modules, evaluation was conducted in the same evaluation manner as in Example 1.

The evaluated results obtained are collectively shown in Table 1.

EXAMPLE 7

The procedures of Example 2 were repeated, except that neither the crosslinking agent nor the crosslinking assistant were used upon forming the surface side filler, to thereby obtain a plurality of solar cell modules.

Using the resultant solar cell modules, evaluation was conducted in the same evaluation manner as in Example 1.

The evaluated results obtained are collectively shown in Table 1.

EXAMPLE 8

The procedures of Example 2 were repeated, except that the amount of the crosslinking agent used upon forming the surface side filler was changed to 10 parts by weight, to thereby obtain a plurality of solar cell modules.

Using the resultant solar cell modules, evaluation was conducted in the same evaluation manner as in Example 1.

The evaluated results obtained are collectively shown in Table 1.

EXAMPLE 9

There were prepared a plurality of solar cell modules by repeating the procedures of Example 1, except for replacing the fluororesin used as the surface side filler in Example 1 by bromotrifluoroethylene-vinyl ether copolymer resin having the following general structural formula (VI) (fluorine content: 24 wt. %, acid value: 2 mg KOH/g, hydroxyl value: 48 mg KOH/g).

$$\sim\sim \underset{F}{\overset{F}{\underset{|}{C}}} - \underset{Br}{\overset{F}{\underset{|}{C}}} - \underset{H}{\overset{H}{\underset{|}{C}}} - \underset{OR}{\overset{H}{\underset{|}{C}}} - \underset{F}{\overset{F}{\underset{|}{C}}} - \underset{Br}{\overset{F}{\underset{|}{C}}} - \underset{H}{\overset{H}{\underset{|}{C}}} - \underset{O}{\overset{H}{\underset{|}{C}}} - \underset{F}{\overset{F}{\underset{|}{C}}} - \underset{Br}{\overset{F}{\underset{|}{C}}} - \underset{H}{\overset{H}{\underset{|}{C}}} - \underset{O}{\overset{H}{\underset{|}{C}}} \sim\sim \quad (VI)$$

with $(CH_2)_n$—OH and $(CH_2)_m$—COOH substituents (wherein R is an alkyl radical)

Using the resultant solar cell modules, evaluation was conducted in the same evaluation manner as in Example 1.

The evaluated results obtained are collectively shown in Table 1.

EXAMPLE 10

The procedures of Example 2 were repeated, except that neither UV absorber nor light stabilizer were used upon forming the surface side filler, to thereby obtain a plurality of solar cell modules.

Using the resultant solar cell modules, evaluation was conducted in the same evaluation manner as in Example 1.

The evaluated results obtained are collectively shown in Table 1.

EXAMPLE 11

The procedures of Example 2 were repeated, except that the surface protective film was formed using polyvinylidene fluoride, to thereby obtain a plurality of solar cell modules.

Using the resultant solar cell modules, evaluation was conducted in the same evaluation manner as in Example 1.

The evaluated results obtained are collectively shown in Table 1.

EXAMPLE 12

The procedures of Example 2 were repeated, except that the surface protective film was formed using acrylic resin, to thereby obtain a plurality of solar cell modules.

Using the resultant solar cell modules, evaluation was conducted in the same evaluation manner as in Example 1.

The evaluated results obtained are collectively shown in Table 1.

COMPARATIVE EXAMPLE 1

Figure 13:
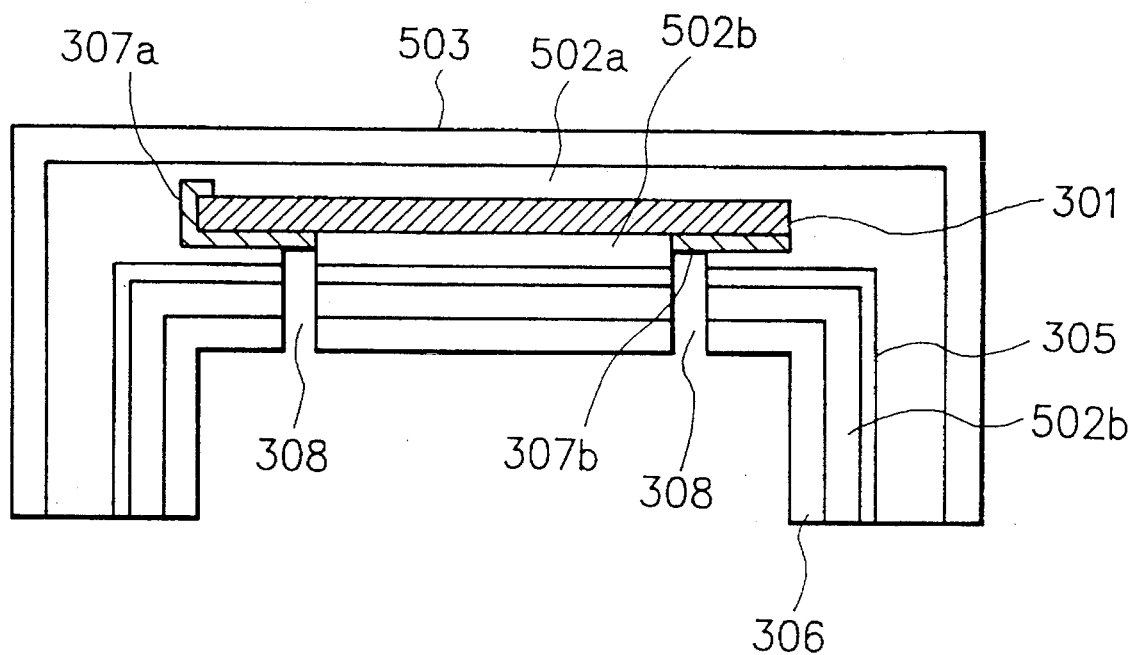
FIG. 13 is a schematic cross-sectional view illustrating the constitution of a comparative solar cell module.

There were prepared a plurality of solar cell modules each having the configuration shown in FIG. 13 by repeating the procedures of Example 1, except that the surface side filler was formed using EVA.

The configuration of the solar cell module shown in FIG. 13 is similar to that of the solar cell module shown in FIGS. 12(a) and 12(b), wherein in the former, a surface side filler 502(a) and a back face side filler 502b are formed of the same material. Reference numeral 503 in FIG. 13 indicates a surface protective film.

Particularly, a 460 μm thick EVA (ethylene-vinyl acetate copolymer) film 502a (produced by Mobay Company) was laminated on the light receiving face of the a—Si solar cell, and a 50 um thick nondrawn ETFE film 503 (trademark name: AFLEX, produced by Asahi Glass Co., Ltd.) having a surface applied with corona discharging treatment was laminated through the corona-discharged surface on the surface of the EVA sheet. On the rear face of the resultant, there were laminated a 460 μm thick EVA film 502b (produced by Mobay Company), a 63.5 μm thick nylon film 305 (trademark name: DARTEK, produced by Du Pont Company), and a galvalume steel member (or a Zn-coated steel member) 306 in this order. The stacked body thus obtained was placed in a vacuum vessel, wherein it was subjected to heat treatment at 160° C. for 30 minutes while evacuating the inside of the vacuum vessel to a predetermined vacuum degree, followed by cooling to room temperature.

In the above, the power outputting terminal 307a was extended to the rear side of the solar cell so that not only the power outputting terminal 307b but also the power outputting terminal 307a could be wired to the outside through the wiring holes 308.

Thus, there was obtained a solar cell module. The solar cell-free opposite side portions of the solar cell module thus obtained were bent at a curvature of 90° for the purposes of improving the strength of the solar cell module and making the solar cell module to be easily placed at a roof of a building.

In this way, there were obtained a plurality of solar cell modules each having opposite bent portions.

Using the resultant solar cell modules, evaluation was conducted in the same evaluation manner as in Example 1.

The evaluated results obtained are collectively shown in Table 1.

COMPARATIVE EXAMPLE 2

The procedures of Comparative Example 1 were repeated, except that the EVA film as the surface side filler was replaced by a 400 μm thick acid-modified EVA film (trademark name: DUMILAN F-100, produced by Takeda Chemical Industries, Ltd.), to thereby obtain a plurality of solar cell modules.

Using the resultant solar cell modules, evaluation was conducted in the same evaluation manner as in Example 1.

The evaluated results obtained are collectively shown in Table 1.

COMPARATIVE EXAMPLE 3

The procedures of Comparative Example 1 were repeated, except that both the surface side filler and back face side filler were formed using an EMA (ethylene-methylacrylate copolmer) film (trademark name: KURANBETER VT SHEET, produced by Kurabo Industries, Ltd.), to thereby obtain a plurality of solar cell modules.

Using the resultant solar cell modules, evaluation was conducted in the same evaluation manner as in Example 1.

The evaluated results obtained are collectively shown in Table 1.

COMPARATIVE EXAMPLE 4

The procedures of Example 1 were repeated, except that as the crosslinking agent upon forming the surface side filler, blocked isocyanate was used in such an amount that the NCO value of the isocyanate became equal to the OH value of the fluororesin and no crosslinking assistant was used, to thereby obtain a plurality of solar cell modules.

Using the resultant solar cell modules, evaluation was conducted in the same evaluation manner as in Example 1.

The evaluated results obtained are collectively shown in Table 1.

COMPARATIVE EXAMPLE 5

There were prepared a plurality of solar cell modules by repeating the procedures of Example 1, except for replacing the fluororesin used as the surface side filler in Example 1 by tetrafluoroethylene-vinyl ether copolymer resin having the following general structural formula (VII) (fluorine content: 44 wt. %, acid value: 2 mg KOH/g, hydroxyl value: 48 mg KOH/g).

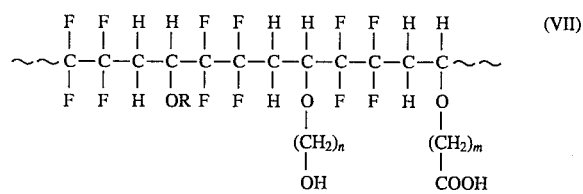

(wherein R is an alkyl group)

COMPARATIVE EXAMPLE 6

Figure 14:
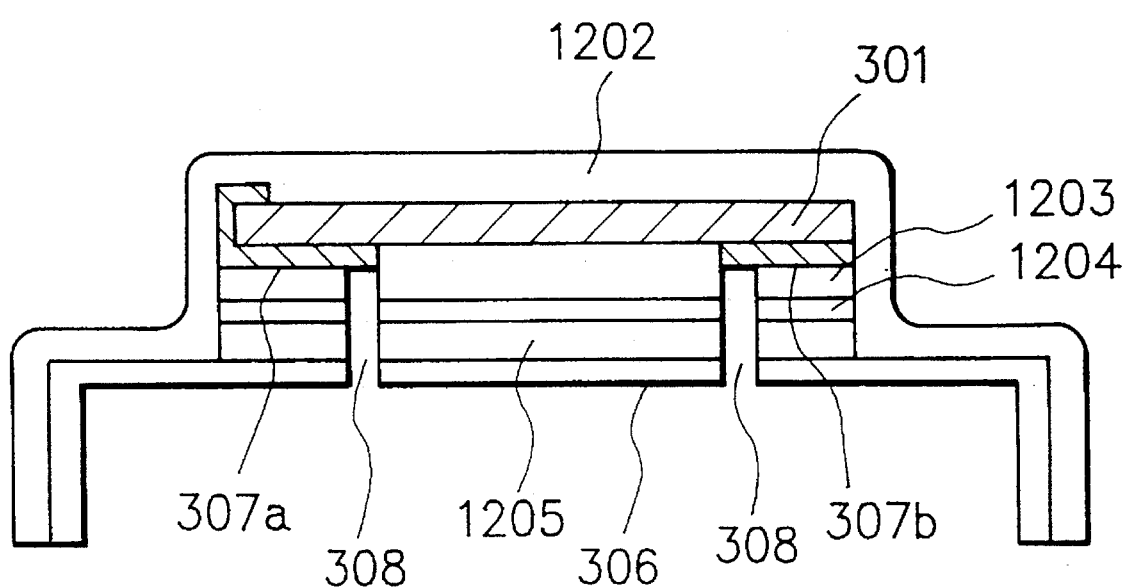
FIG. 14 is a schematic cross-sectional view illustrating the constitution of another comparative solar cell module.

There were prepared a plurality of solar cell modules each having the configuration shown in FIG. 14.

In FIG. 14, reference numeral 301 indicates a photovoltaic element, 1202 a surface protective film, reference numerals 1203 and 1205 each an adhesive, reference numeral 1204 a back face protective film, reference numeral 306 a back face reinforcing member, reference numerals 307a and 307b each a power outputting terminal, and reference numeral 308 a wiring hole for each outputting terminal. The configuration shown in FIG. 14 has opposite externally extended, photovoltaic element-free portions each comprising a composite laminate comprising the surface protective film 1202 laminated on the back face reinforcing member. Each of the wiring holes 308 is penetrated through the back face members to reach the corresponding power outputting terminal.

Firstly, there was prepared an a—Si solar cell by repeating the procedures of preparing the solar cell in in Example 1.

Using the a—Si solar cell obtained in the above, there was prepared a solar cell module in the following manner.

That is, a nylon film 1204 was bonded onto the rear face of the photovoltaic element 301 of the solar cell by using an epoxy adhesive 1203, and a galvalume steel member 306 was bonded onto the surface of the nylon film by using an epoxy adhesive 306. In this case, the power outputting terminal 307a was extended to the rear side of the photoelectric conversion element so that not only the power outputting terminal 307b but also the power outputting terminal 307a could be wired to the outside through the wiring holes 308 penetrated from the back face reinforcing member side.

Successively, 100 parts by weight of clorotrifluoroethylene-vinyl ether copolymer resin having the foregoing general structural formula (III) (trademark name: LUMIFLON LF-400 (fluorine content: 30 wt. %, acid value: 2 mg KOH/g, hydroxyl value: 48 mg KOH/g), produced by Asahi Glass Co., Ltd.) (which was used in Example 1), 0.3 part by weight of γ-methacryloxypropyltrimethoxysilane as a coupling agent (trademark name: SZ6030, produced by Toray Dow Corning Silicone Company), 0.3 part by weight of 2-hydroxy-4-n-octoxybenzophenone as a UV absorber (trademark name: CYASORB UV-531, produced by American Cyanamid Company), and 0.2 part by weight of tris-(mono-nonylphenyl)phosphate as an antioxidant (trademark name: NOUGARD P, produced by Uniroyal Chemical Company, Inc.) were introduced into xylene while stirring, followed by adding blocked isocyanate as a crosslinking agent (which was used in Comparative Example 4) without using any crosslinking assistant wherein the isocyanate was added in such an amount that the NCO value thereof became equal to the OH value of the fluororesin, whereby a xylene solution with a resin content of 50 wt. % was obtained.

The resultant xylene solution was applied not only onto the light receiving face of the photovoltaic element 301 but also onto the surface of the back face reinforcing member 306 in an amount to provide a thickness of about 220 um when dried, followed by repetition of a drying process at 60° C. for 30 minutes, whereby forming an about 220 um resin layer. This resin layer was successively cured at 160 ° C. for 30 minutes, whereby a surface protective layer 1202 composed of the fluororesin was formed not only on the photoelectric conversion element 301 but also on the the back face reinforcing member 306.

Thus, there was obtained a solar cell module. The solar cell-free opposite side portions of this module were bent at a curvature of 90°.

In this way, there were obtained a plurality of solar cell modules each having opposite bent portions.

Using the resultant solar modules, evaluation was conducted in the same evaluation manner as in Example 1.

The evaluated results obtained are collectively shown in Table 1.

From the results shown in Table 1, the following facts are understood.

That is, any of the solar cell modules obtained in Examples 1 to 12 belonging to the present invention are apparently surpassing the solar cell modules obtained in Comparative Examples 1 to 5 in terms of a reduction in the initial photoelectric conversion efficiency after having been exposed to severer environmental conditions. As for the solar cell module obtained in Comparative Example 6, although it is similar to those obtained in Examples 1 to 12, it is apparently inferior in terms of weatherability and resistance to scratching.

More detailed description will be made of this situation.

Any of the solar cell modules each having a surface side filler comprising a specific fluororesin (that is, chlorotrifluoroethylene-vinyl copolymer) and a crosslinking agent obtained in Examples 1 to 3 is completely free of occurrence of yellowing, clouding and deformation for the surface side filler even upon continuous exposure to severe environmental conditions over a long period of time and markedly excels in heat resistance and weatherability. And as the results shown in Table 1 illustrate, these solar cells are never changed in terms of external appearance even when they are continuously exposed to frequent changes in the environmental temperature or to frequent changes in the environmental temperature and humidity. Particularly, in comparison with the solar cell modules each having a surface side filler comprising a conventional thermoplastic and transparent resin used as the surface side filler in a conventional solar cell module, i.e., EVA or EMA, obtained in Comparative Examples 1 to 3, any of the solar cell modules obtained in Examples 1 to 3 is markedly surpassing said comparative solar cell modules especially in terms of moisture resistance, wherein after having been continuously exposed to irradiation of sunlight in a severer atmosphere of 85° C./85%RH over a long period of time, any of the solar cell modules obtained in Examples 1 to 3 is extremely slight in terms of a reduction in the initial photoelectric conversion efficiency, however the solar cell modules obtained in Comparative Examples 1 to 3 are significant in terms of a reduction in the initial photoelectric conversion efficiency.

In the case of the solar cell module having a surface side filler comprising chlorotrifluoroethylene-vinyl copolymer resin of 0 mg in acid value and 58 mg in hydroxyl value obtained in Example 4, there is a tendency of causing an extremely slight removal at the interface between the surface side filler and the surface protective layer upon continuous exposure to frequent changes in the environmental temperature and humidity over a long period of time because the copolymer resin is of an acid value of 0 mg. However, as apparent from the results shown in Table 1, the solar cell module excels in weatherability and heat resistance, it is extremely slight in terms of a reduction in the initial photoelectric conversion efficiency after having been continuously exposed to irradiation of sunlight in a severer atmosphere of 85° C./85%RH over a long period of time although it is slightly inferior to the solar cell modules obtained in Examples 1 to 3, and it is apparently surpassing the solar cell modules obtained in Comparative Examples 1 to 5.

In the case of the solar cell module having a surface side filler comprising chlorotrifluoroethylene-vinyl ester copolymer resin of 3 mg in acid value and 53 mg in hydroxyl value obtained in Example 5, it is slightly inferior to the solar cell modules obtained in Examples 1 to 3 in terms of moisture resistance wherein it has a tendency of causing a slight reduction in the initial photoelectric conversion efficiency after having been continuously exposed to irradiation of sunlight in a severer atmosphere of 85° C./85%RH over a long period of time because the copolymer resin used as the surface side filler thereof is of a hydroxyl value of 53 mg. However, it excels in weatherability and heat resistance, and is apparently surpassing the solar cell modules obtained in Comparative Examples 1 to 5.

In the case of the solar cell module having a surface side filler formed in the same manner as in Example 2 except for not using any silane coupling agent obtained in Example 6, although there is a tendency of slightly reducing the adhesion of the surface side filler with the element, it excels in weatherability, heat resistance, and moisture resistance. And it is apparently surpassing the solar cell modules obtained in Comparative Examples 1 to 5.

In the case of the solar cell module having a surface side filler formed in the same manner as in Example 2 except for using neither the crosslinking agent nor the crosslinking assistant obtained in Example 7, although the surface side filler has a tendency of being slightly deformed upon exposure to elevated temperature over a long period of time, the solar cell module excels in weatherability, and satisfactory in moisture resistance although it is slightly inferior to the solar cell module obtained in Example 2. And it is apparently surpassing the solar cell modules obtained in Comparative Examples 1 to 5.

In the case of the solar cell module having a surface side filler formed in the same manner as in Example 2 except for using the crosslinking agent in an excessive amount obtained in Example 8, although it is slightly inferior to the solar cell module obtained in Example 2 in terms of heat resistance and moisture resistance, it is apparently surpassing the solar cell modules obtained in Comparative Examples 1 to 5.

In the case of the solar cell module having a surface side filler formed in the same manner as in Example 1 except for using a different fluororesin, i.e., bromotrifluoroethylene-vinyl ether copolymer resin, obtained in Example 9, there is a tendency of causing an extremely slight removal at the interface between the surface side filler and the surface protective film upon continuous exposure to frequent changes in the environmental temperature and humidity over a long period of time because the copolymer resin is relatively inferior in terms of flexibility. However, as apparent from the results shown in Table 1, although the solar cell module is slightly inferior to the solar cell module obtained in Example 1 in termes of heat resistance and moisture resistance, it excels in weatherability and is satisfactory in heat resistance and moisture resistance, and it is apparently surpassing the solar cell modules obtained in Comparative Examples 1 to 5.

In the case of the solar cell module having a surface side filler formed in the same manner as in Example 2 except for using neither the UV absorber nor the light stabilizer obtained in Example 10, although it is slightly inferior to the solar cell module obtained in Example 2 in terms of moisture resistance, it excels in weatherability and heat resistance and is satisfactory in moisture resistance, and is apparently surpassing the solar cell modules obtained in Comparative Examples 1 to 5.

In the case of the solar cell module obtained in Example 11, having a surface side filler formed in the same manner as in Example 2 and wherein the surface protective film is comprised of polyvinylidene fluoride, it is slightly inferior to the solar cell module obtained in Example 2 in terms of initial photoelectric conversion efficiency and also in terms of moisture resistance because of the surface protective film which is relatively inferior in transparency. However the solar cell module itself excels in weatherability and heat resistance and is satisfactory in moisture resistance, and is apparently surpassing the solar cell modules obtained in Comparative Examples 1 to 5.

In the case of the solar cell module obtained in Example 12, having a surface side filler formed in the same manner as in Example 2 and wherein the surface protective film is comprised of acrylic resin, it is inferior to the solar cell module obtained in Example 2 in terms of weatherability because of the surface protective film comprised of acrylic resin which is relatively inferior in weatherability. The solar cell module itself excels in weatherability and heat resistance and is satisfactory in moisture resistance, and it is apparently surpassing the solar cell modules obtained in Comparative Examples 1 to 5.

In the case of the solar cell module having a surface side filler comprised of EVA obtained in Comparative Example 1, it is apparently inferior to any of the solar cell modules obtained in Examples 1 to 12. Particularly, this comparative solar cell module is apparently inferior in heat resistance wherein upon exposure to elevated temperature over a long period of time, the surface side filler is readily yellowed to result in causing a remarkable reduction in the initial photoelectric conversion efficiency, and the surface protective film is readily removed from the surface side filler upon exposure to frequent changes in the environmental temperature and moisture because the surface side filler is poor in adhesion, and further, the surface side filler is poor in moisture resistance and because of this, the initial photoelectric conversion efficiency is markedly reduced upon continuous use in an atmosphere of high temperature and high humidity over a long period of time.

In the case of the solar cell module obtained in Comparative Example 2, having a surface side filler formed in the same manner as in Comparative Example 1 except for using acid-modified EVA having a relatively high adhesion instead of the EVA, although the problem of causing a removal between the surface side filler and the protective film in the solar cell module obtained in Comparative Example 1 is improved, it is inferior in weatherability, heat resistance, and moisture resistance as well as the solar cell module obtained in Comparative Example 1.

In the case of the solar cell module obtained in Comparative Example 3, having a surface side filler formed in the same manner as in Comparative Example 1 except for using EMA instead of the EVA, it is inferior in weatherability, heat resistance, and moisture resistance as well as the solar cell module obtained in Comparative Example 1.

In the case of the solar cell module obtained in Comparative Example 4, having a surface side filler formed in the same manner as in Example 1 except for using blocked isocyanate as the crosslinking agent without using any crosslinking assistant, it is inferior in weatherability, heat resistance, endurance against frequent changes in the environmental temperature, and moisture resistance wherein particularly upon exposure to continuous light irradiation under severer environmental conditions over a long period of time, the surface side filler has a tendency of being readily yellowed and clouded, and in addition to this, upon continuous exposure to elevated temperature, the surface side filler has a tendency of being readily deformed. Further in addition, this comparative solar cell module is remarkable in terms of a reduction in the initial photoelectric conversion efficiency after having been continuously exposed to irradiation of sunlight in a severer atmosphere of 85° C./85%RH over a long period of time.

In the case of the solar cell module obtained in Comparative Example 5, having a surface side filler formed in the same manner as in Example 1 except for replacing the fluororesin by tetrafluoroethylene-vinyl ether copolymer resin, although it is satisfactory in weatherability and heat resistance, the surface side filler thereof is poor in adhesion not only with the surface protective film but also the element because said copolymer resin contains fluorine in an increased amount wherein a removal is readily occurred at the interface between the surface side filler and the surface protective film or the element upon continuous exposure to frequent changes in the environmental temperature and humidity. In addition to this, this comparative solar cell module is not satisfactory in moisture resistance.

In the case of the solar cell module obtained in Comparative Example 6 in which the photovoltaic element is coated only by a layer comprised of the same fluororesin used as the surface side filler in Example 1, it is apparently inferior in weatherability and resistance to scratching because it is extremely difficult to uniformly and completely coat irregularities present at the surface of the photovoltaic elements only such fluororesin and the surface of the coat comprised of such fluororesin has a tendency of being readily polluted.

From the above description, the followings are understood. That is, the photoelectric conversion module (or the solar cell module) according to the present invention in which a coating comprising at least a transparent filler and a transparent protective layer is disposed on the light receiving face of a photovoltaic element so as to encapsulate said photovoltaic element wherein said filler comprised of a fluorine-containing polymer with a fluorine content of 20 wt. % to 40 wt. % makes it possible to eliminate the problems relating to particularly weatherability and heat resistance in the prior art and to attain an improved reliability for the surface coating of the photovoltaic element upon repeated use under severe environmental conditions in outdoors. This situation is further improved in the case where the transparent filler is comprised of a crosslinked product of a copolymer of chlorotrifluoroethylene and vinyl monomer. Further, in the case where a fluororesin with a fluorine content of 40 wt. % to 60 wt. % is disposed on the above filler, the above situation is significantly improved.

In addition, the surface side filler according to the present invention effectively prevent the photovoltaic element from being suffered from moisture invasion and because of this, the photovoltaic element is enabled to exhibit a desirable photoelectric conversion efficiency without being deteriorated even upon repeated use over a long period of time in outdoors.

TABLE 1

| | fluorine content in the surface side filler resin | gel content of the surface side filler resin | initial photoelectric conversion efficiency | weatherability | heat resistance appearance | relative reduction proportion to the initial photoelectric conversion efficiency |
|---|---|---|---|---|---|---|
| Example 1 | 28 wt. % | 80 wt. % | 1 | ○ | ○ | 0% |
| Example 2 | 28 wt. % | 85 wt. % | 1 | ○ | ○ | 0% |
| Example 3 | 23 wt. % | 70 wt. % | 1 | ○ | ○ | 0% |
| Example 4 | 26 wt. % | 77 wt. % | 1.02 | ○ | ○ | 0% |
| Example 5 | 23 wt. % | 71 wt. % | 1 | ○ | ○ | 0% |
| Example 6 | 28 wt. % | 86 wt. % | 1 | ○ | ○ | 0% |
| Example 7 | 29 wt. % | 0 wt. % | 1 | ○ | the surface side filler slightly deformed | 0.5% |
| Example 8 | 26 wt. % | 88 wt. % | 1 | ○ | ○ | 0.9% |
| Example 9 | 22 wt. % | 76 wt. % | 1 | ○ | ○ | 0.5% |
| Example 10 | 28 wt. % | 85 wt. % | 1.04 | ○ | ○ | 0% |
| Example 11 | 28 wt.% | 84 wt. % | 0.98 | ○ | ○ | 0% |
| Example 12 | 28 wt. % | 85 wt. % | 0.98 | slight clouding occurred in the surface protective film | ○ | 1% |
| Comparative Example 1 | 0 wt. % | 88 wt. % | 1 | ○ | the surface side filler yellowed | 8% |

TABLE 1-continued

| | | | | | | |
|---|---|---|---|---|---|---|
| Comparative Example 2 | 0 wt. % | 0 wt. % | 0.96 | clouding occurred in the surface side filler | the surface side filler yellowed and deformed | 10% |
| Comparative Example 3 | 0 wt. % | 74 wt. % | 1 | yellowing occurred in the surface side filler | the surface side filler yellowed and deformed | 7% |
| Comparative Example 4 | 21 wt. % | 43 wt. % | 0.98 | yellowing and clouding occurred in the surface side filler | the surface side filler yellowed and deformed | 9% |
| Comparative Example 5 | 41 wt. % | 76 wt. % | 0.95 | ○ | ○ | 0% |
| Comparative Example 6 | 26 wt. % | 95 wt. % | 0.94 | the surface apparently polluted | ○ | 0% |

| | endurance against changes in environmental temperature | endurance against changes in environmental temperature and humidity | moisture resistance | resistance to resistance to scratching |
|---|---|---|---|---|
| Example 1 | ○ | ○ | 2.5% | ○ |
| Example 2 | ○ | ○ | 1.7% | ○ |
| Example 3 | ○ | ○ | 3% | ○ |
| Example 4 | ○ | extremely slight removal occurred at the surface protective film | 3.8% | ○ |
| Example 5 | ○ | ○ | 3.5% | ○ |
| Example 6 | ○ | extremely slight removal occurred at the interface between the element and the surface side filler | 2.3% | ○ |
| Example 7 | ○ | ○ | 5% | ○ |
| Example 8 | ○ | ○ | 2.5% | ○ |
| Example 9 | ○ | extremely slight removal occurred at the interface between the element and the surface side filler | 3% | ○ |
| Example 10 | ○ | ○ | 2% | ○ |
| Example 11 | ○ | ○ | 2.3% | ○ |
| Example 12 | ○ | ○ | 1.5% | ○ |
| Comparative Example 1 | ○ | the surface protective film apparently removed | 25% | ○ |
| Comparative Example 2 | ○ | the surface protective film slightly removed | 28% | ○ |
| Comparative Example 3 | ○ | the surface protective film slightly removed | 12% | ○ |
| Comparative Example 4 | the surface protective film removed | the surface side filler clouded, and the surface protective film removed | 30% | ○ |
| Comparative Example 5 | the surface protective film removed | the surface protective film removed, and an apparent removal occurred at the interface between the element and the surface side filler | 8% | ○ |
| Comparative Example 6 | ○ | ○ | 3.3% | x |

What is claimed is:

1. A photoelectric conversion device including a photoelectric conversion element comprising a substrate, a photoelectric conversion layer with at least a pair of electrodes disposed on said substrate, a transparent resin layer comprising a fluorine-containing polymer resin, and a transparent surface layer, said transparent resin layer being disposed between said photoelectric conversion element and said transparent surface layer, characterized in that said fluorine-containing polymer resin is a copolymer of fluoroethylene and vinyl monomer, wherein said copolymer has a fluorine content of 20 wt. % to 40 wt. % and is crosslinked with a peroxide.

2. A photoelectric conversion device according to claim 1, wherein the fluorine-containing polymer resin comprises a crosslinked product of a copolymer of chlorotrifluoroethylene and vinyl monomer.

3. A photoelectric conversion device according to claim 2, wherein the copolymer has an acid value of 2 or more.

4. A photoelectric conversion device according to claim 2, wherein the copolymer has a hydroxyl value of 50 or less.

5. A photoelectric conversion device according to claim 2, wherein the vinyl monomer of the copolymer includes a vinyl ether with a side chain having a long chain alkyl group.

6. A photoelectric conversion device according to claim 2, wherein the vinyl monomer of the copolymer includes a vinyl ester with a side chain having a long chain alkyl group.

7. A photoelectric conversion device according to claim 1, wherein the fluorine-containing polymer resin contains a coupling agent.

8. A photoelectric conversion device according to claim 1, wherein the transparent surface layer comprises a resin film having a surface contact angle of 70° or more against water.

9. A photoelectric conversion device according to claim 1, wherein the transparent surface layer comprises an organic polymer resin.

10. A photoelectric conversion device according to claim 1, wherein the transparent surface layer comprises a fluorine-containing polymer.

11. A photoelectric conversion device according to claim 10, wherein the fluorine-containing polymer has a fluorine content of 40 wt. % to 60 wt. %.

12. A photoelectric conversion device according to claim 10, wherein the fluorine-containing polymer is tetrafluoroethylene-ethylene copolymer.

13. A photoelectric conversion device according to claim 1, wherein the face of the transparent surface layer to be contacted with the transparent resin layer is applied with corona discharging treatment, plasma treatment, ozone treatment, UV treatment, electron beam treatment, or flame treatment.

14. A photoelectric conversion device according to claim 1, wherein the transparent surface layer comprises a nondrawn resin film.

15. A photoelectric conversion device according to claim 1, wherein the photoelectric conversion layer has an amorphous semiconductor thin film.

16. A photoelectric conversion device according to claim 15, wherein the amorphous semiconductor thin film is composed of an amorphous silicon material.

17. A module including (a) a photoelectric conversion element comprising a substrate, a photoelectric conversion layer with at least a pair of electrodes disposed on said substrate, (b) a transparent resin layer comprising a fluorine-containing polymer resin, (c) a transparent surface layer, and (d) a reinforcing member, said transparent resin layer and said transparent surface layer being disposed in this order on the light receiving face of said photoelectric conversion element and said reinforcing member being disposed on the rear side of said photoelectric conversion element, characterized in that said fluorine-containing polymer resin is a copolymer of fluoroethylene and vinyl monomer, wherein said copolymer has a fluorine content of 20 wt. % to 40 wt. % and is crosslinked with a peroxide.

18. A module according to claim 17, wherein the fluorine-containing polymer resin comprises a crosslinked product of a copolymer of chlorotrifluoroethylene and vinyl monomer.

19. A module according to claim 18, wherein the copolymer has an acid value of 2 or more.

20. A module according to claim 18, wherein the copolymer has a hydroxyl value of 50 or less.

21. A module according to claim 18, wherein the vinyl monomer of the copolymer includes a vinyl ether with a side chain having a long chain alkyl group.

22. A module according to claim 18, wherein the vinyl monomer of the copolymer includes a vinyl ester with a side chain having a long chain alkyl group.

23. A module according to claim 17, wherein the fluorine-containing polymer resin contains a coupling agent.

24. A module according to claim 17, wherein the transparent surface layer comprises a resin film having a surface contact angle of 70° or more against water.

25. A module according to claim 17, wherein the transparent surface layer comprises an organic polymer resin.

26. A module according to claim 17, wherein the transparent surface layer comprises a fluorine-containing polymer.

27. A module according to claim 26, wherein the fluorine-containing polymer has a fluorine content of 40 wt. % to 60 wt. %.

28. A module according to claim 26, wherein the fluorine-containing polymer is tetrafluoroethylene-ethylene copolymer.

29. A module according to claim 17, wherein the face of the transparent surface layer to be contacted with the transparent resin layer is applied with corona discharging treatment, plasma treatment, ozone treatment, UV treatment, electron beam treatment, or flame treatment.

30. A module according to claim 17, wherein the transparent surface layer comprises a nondrawn resin film.

31. A module according to claim 17, wherein the photoelectric conversion layer has an amorphous semiconductor thin film.

32. A module according to claim 31, wherein the amorphous semiconductor thin film is composed of an amorphous silicon material.

33. A module according to claim 17, wherein the reinforcing member has an end portion bent together at least the transparent resin layer.

34. A photoelectric conversion device including a photoelectric conversion element comprising a substrate, a photoelectric conversion layer with at least a pair of electrodes disposed on said substrate, a transparent resin layer comprising a fluorine-containing polymer resin, and a transparent surface layer, said transparent resin layer being disposed between said photoelectric conversion element and said transparent surface layer, characterized in that said fluorine-containing polymer resin is a copolymer of fluoroethylene and vinyl monomer, wherein said copolymer has a fluorine content of 20 wt. % to 40 wt. % and contains neither a crosslinking agent nor a crosslinking assistant.

35. A photoelectric conversion device according to claim 34, wherein the fluorine-containing polymer resin comprises a copolymer of chlorotrifluoroethylene and vinyl monomer.

36. A photoelectric conversion device according to claim 35, wherein the copolymer has an acid value of 2 or more.

37. A photoelectric conversion device according to claim 35, wherein the copolymer has a hydroxyl value of 50 or less.

38. A photoelectric conversion device according to claim 35, wherein the vinyl monomer of the copolymer includes a vinyl ether with a side chain having a long chain alkyl group.

39. A photoelectric conversion device according to claim 35, wherein the vinyl monomer of the copolymer includes a vinyl ester with a side chain having a long chain alkyl group.

40. A module including (a) a photoelectric conversion element comprising a substrate, a photoelectric conversion layer with at least a pair of electrodes disposed on said substrate, (b) a transparent resin layer comprising a fluorine-containing polymer resin, (c) a transparent surface layer, and (d) a reinforcing member, said transparent resin layer and said transparent surface layer being disposed in this order on the light receiving face of said photoelectric conversion element and said reinforcing member being disposed on the rear side of said photoelectric conversion element, characterized in that said fluorine-containing polymer resin is a copolymer of fluoroethylene and vinyl monomer, wherein said copolymer has a fluorine content of 20 wt. % to 40 wt. % and contains neither a crosslinking agent nor a crosslinking assistant.

41. A module according to claim 40, wherein the fluorine-containing polymer resin comprises a copolymer of chlorotrifluoroethylene and vinyl monomer.

42. A module according to claim 41, wherein the copolymer has an acid value of 2 or more.

43. A module according to claim 41, wherein the copolymer has a hydroxyl value of 50 or less.

44. A module according to claim 41, wherein the vinyl monomer of the copolymer includes a vinyl ether with a side chain having a long chain alkyl group.

45. A module according to claim 41, wherein the vinyl monomer of the copolymer includes a vinyl ester with a side chain having a long chain alkyl group.

* * * * *

UNITED STATES PATENT AND TRADEMARK OFFICE
CERTIFICATE OF CORRECTION

PATENT NO. : 5,530,264

DATED : June 25, 1996

INVENTOR(S): Ichiro Kataoka et al.

It is certified that error appears in the above-identified patent and that said Letters Patent is hereby corrected as shown below:

COLUMN 2

Line 43, "above described" should read --above-described--.

COLUMN 3

Line 32, "gellation" should read --gelation--.
    Line 40, "terms" should read --in terms--.
    Line 41, "in" should be deleted.
    Line 53, "obtained" should read --investigated--.

COLUMN 4

Line 47, "problems" should read --problems,--.
    Line 53, "lightweight," should read --light weight,-- and "reductin" should read --reduction--.

COLUMN 5

Line 6, "period" should read --period of--.
    Line 33, "of of" should read --of--.

COLUMN 6

Line 31, "view" should read --views--.
    Line 67, "above described should read --above-described--.

UNITED STATES PATENT AND TRADEMARK OFFICE
CERTIFICATE OF CORRECTION

PATENT NO. : 5,530,264

DATED : June 25, 1996

INVENTOR(S) : Ichiro Kataoka et al.

It is certified that error appears in the above-identified patent and that said Letters Patent is hereby corrected as shown below:

COLUMN 7

Line 65, "imported" should read --imparted--.

COLUMN 8

Line 29, "is" should be deleted.

COLUMN 9

Line 4, "addition" should read --addition to--.
   Line 23, "attain" should read --attained--.

COLUMN 11

Line 28, "to" should read --to as--.
   Line 49, "entire" should read --entirety--.

COLUMN 12

Line 31, "oxide" should read --oxides--.
   Line 55, "above mentioned" should read --above-mentioned--.

UNITED STATES PATENT AND TRADEMARK OFFICE
CERTIFICATE OF CORRECTION

PATENT NO. : 5,530,264

DATED : June 25, 1996

INVENTOR(S) : Ichiro Kataoka et al.

It is certified that error appears in the above-identified patent and that said Letters Patent is hereby corrected as shown below:

COLUMN 13

Line 5, "above mentioned" should read --above-mentioned--.
Line 17, "above mentioned" should read --above-mentioned--.
Line 20, "above described" should read --above-described.
Line 48, "above" should read --above- --.
Line 60, "FIG.3(A)." should read --FIG.3(a).--.

COLUMN 14

Line 12, "terephtharate" should read --terephthalate--.

COLUMN 16

Line 51, "t-butperoxymaleate," should read --t-butylperoxymaleate,--.

COLUMN 18

Line 3, "having" should read --having been--.
Line 4, "a" should read --an--.
Line 30, "resulting" should read --resulting in--.

UNITED STATES PATENT AND TRADEMARK OFFICE
CERTIFICATE OF CORRECTION

PATENT NO. : 5,530,264

DATED : June 25, 1996

INVENTOR(S) : Ichiro Kataoka et al.

It is certified that error appears in the above-identified patent and that said Letters Patent is hereby corrected as shown below:

COLUMN 19

Line 19, "γ-metacryloxypropylt-" should read
      --γ-methacryloxypropylt--.
    Line 54, "ditert" should read --di-tert--.

COLUMN 21

Line 12, "above described" should read --above-
      described--.
    Line 65, "area" should read --circled area--.
    Line 66, "908" should be deleted.
    Line 67, "entire" should read --entirety--.

COLUMN 22

Line 12, "an" should read --a--.
    Line 32, "occurs" should read --arises-- and "is
      often occurred" should read --often occurs--.

COLUMN 23

Line 23, "obtain" should read --obtained--.

UNITED STATES PATENT AND TRADEMARK OFFICE
CERTIFICATE OF CORRECTION

PATENT NO. : 5,530,264

DATED : June 25, 1996

INVENTOR(S) : Ichiro Kataoka et al.

It is certified that error appears in the above-identified patent and that said Letters Patent is hereby corrected as shown below:

COLUMN 24

Line 25, "view" should read --views--.
    Line 28, "this manner" should be deleted.
    Line 29, "this manner" should be deleted.

COLUMN 25

Line 45, "chlorotrifluoroetylene-vinyl" should read
    --chlorotrifluoroethylene-vinyl--.
    Line 60, "dicuminyl" should read --dicumenyl--.

COLUMN 28

Line 6, "a" should read --an--.
    Line 11, "of" should read --for--.
    Line 22, "current" should read --current is--.

COLUMN 29

Line 7, "triallyloyanurate" should read
    --triallylcyanurate--.
    Line 8, "of -methacryloxypropyltrimethoxysilane"
    should read --of $\gamma$-methacryloxypropyltrimethoxysilane--.
    Line 22, "above described" should read --above-described--.

UNITED STATES PATENT AND TRADEMARK OFFICE
CERTIFICATE OF CORRECTION

PATENT NO. : 5,530,264

DATED : June 25, 1996

INVENTOR(S): Ichiro Kataoka et al.

Page 6 of 7

It is certified that error appears in the above-identified patent and that said Letters Patent is hereby corrected as shown below:

COLUMN 30

Line 26, "clorotrifluoroethylene-vinylester" should read --chlorotrifluoroethylene-vinylester--.

COLUMN 32

Line 54, "copolmer)" should read --copolymer)--.

COLUMN 33

Line 54, "adhesive 306." should read --adhesive 1205.--.
Line 62, "clorotrifluoroethyl-" should read --chlorotrifluoroethyl- --.

COLUMN 34

Line 24, "the the" should read --the--.

COLUMN 36

Line 16, "termes" should read --terms--.
Line 37, "However" should read --However,--.

UNITED STATES PATENT AND TRADEMARK OFFICE
CERTIFICATE OF CORRECTION

PATENT NO. : 5,530,264

DATED : June 25, 1996

INVENTOR(S) : Ichiro Kataoka et al.

It is certified that error appears in the above-identified patent and that said Letters Patent is hereby corrected as shown below:

COLUMN 38

```
Line 16, "only" should read --because only--.
Line 38, "prevent" should read --prevents--.
Line 39, "suffered" should read --damaged--.
```

COLUMN 39

```
TABLE 1-continued, "resistance to resistance to
 scratching" should read --resistance to scratching--.
```

COLUMN 42

```
Line 8, "at least" should read --at least at--.
```

Signed and Sealed this

Twenty-sixth Day of November 1996

Attest:

BRUCE LEHMAN

*Attesting Officer*     *Commissioner of Patents and Trademarks*